US012557531B2

(12) United States Patent
Chen et al.

(10) Patent No.: US 12,557,531 B2
(45) Date of Patent: Feb. 17, 2026

(54) DISPLAY PANEL AND DISPLAY DEVICE

(71) Applicant: BOE TECHNOLOGY GROUP CO., LTD., Beijing (CN)

(72) Inventors: Dengyun Chen, Beijing (CN); Yunjin Liu, Beijing (CN); Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 439 days.

(21) Appl. No.: 17/922,406

(22) PCT Filed: Mar. 15, 2021

(86) PCT No.: PCT/CN2021/080865
§ 371 (c)(1),
(2) Date: Oct. 31, 2022

(87) PCT Pub. No.: WO2021/238343
PCT Pub. Date: Dec. 2, 2021

(65) Prior Publication Data
US 2023/0200188 A1    Jun. 22, 2023

(30) Foreign Application Priority Data

May 28, 2020   (CN) .......................... 202010466036.4
Sep. 30, 2020  (CN) .......................... 202011062894.9

(51) Int. Cl.
*H10K 59/80*     (2023.01)
*H10D 89/60*     (2025.01)
(Continued)

(52) U.S. Cl.
CPC ......... *H10K 59/878* (2023.02); *H10D 89/601* (2025.01); *H10K 59/131* (2023.02);
(Continued)

(58) Field of Classification Search
CPC .. H10K 59/878; H10K 59/131; H10K 59/873; H10K 59/8731; H10K 59/40
See application file for complete search history.

(56) References Cited

U.S. PATENT DOCUMENTS 9,245,936 B2    1/2016  Choi et al.
2011/0234509 A1  9/2011  Lee et al.
(Continued)

FOREIGN PATENT DOCUMENTS

CN          2693113 Y      4/2005
CN       101153969 A       4/2008
(Continued)

OTHER PUBLICATIONS

China Patent Office, CN202010466036.4 First Office Action issued on Jul. 8, 2022.
(Continued)

*Primary Examiner* — David Vu
*Assistant Examiner* — Brandon C Fox
(74) *Attorney, Agent, or Firm* — HOUTTEMAN LAW, LLC

(57) ABSTRACT

Embodiments of the present disclosure provide a display panel and a display device, the display panel includes: a base substrate; a plurality of light emitting devices on the base substrate; an encapsulation layer covering the light emitting devices; a mirror layer located on a side of the encapsulation layer away from the base substrate, the mirror layer including a plurality of first openings, and an orthographic projection of each first opening on the base substrate overlapping an orthographic projection of at least one light emitting device on the base substrate; a transparent filling layer located on a side of the encapsulation layer away from the base substrate, at least part of the transparent filling layer being located in the first openings.

18 Claims, 8 Drawing Sheets

(51) Int. Cl.
*H10K 59/131* (2023.01)
*H10K 59/40* (2023.01)

(52) U.S. Cl.
CPC ............ *H10K 59/40* (2023.02); *H10K 59/873* (2023.02); *H10K 59/8731* (2023.02)

(56) References Cited

U.S. PATENT DOCUMENTS

| | | | |
|---|---|---|---|
| 2014/0332765 A1 | 11/2014 | Kim | |
| 2017/0069808 A1 | 3/2017 | Kim et al. | |
| 2017/0104182 A1* | 4/2017 | Kim | H10K 59/38 |
| 2017/0116929 A1 | 4/2017 | Hirakata | |
| 2018/0188866 A1* | 7/2018 | Heo | H10K 59/40 |
| 2018/0190740 A1 | 7/2018 | Bang et al. | |
| 2020/0211477 A1 | 7/2020 | Lai et al. | |
| 2020/0301219 A1 | 9/2020 | Kuroe et al. | |
| 2021/0013270 A1 | 1/2021 | Yu et al. | |
| 2022/0293890 A1* | 9/2022 | Jeong | H10K 59/40 |
| 2023/0172026 A1* | 6/2023 | Lee | H10K 59/878 |
| | | | 345/173 |

FOREIGN PATENT DOCUMENTS

| | | | | |
|---|---|---|---|---|
| CN | 101196658 A | | 6/2008 | |
| CN | 103715681 A | | 4/2014 | |
| CN | 104465713 A | | 3/2015 | |
| CN | 104867450 A | | 8/2015 | |
| CN | 105425457 A | | 3/2016 | |
| CN | 105609658 A | | 5/2016 | |
| CN | 106444135 A | | 2/2017 | |
| CN | 107026245 A | | 8/2017 | |
| CN | 107123664 A | | 9/2017 | |
| CN | 107342284 A | | 11/2017 | |
| CN | 108319090 A | | 7/2018 | |
| CN | 108538894 A | | 9/2018 | |
| CN | 108766994 A | | 11/2018 | |
| CN | 108878480 A | | 11/2018 | |
| CN | 109148719 A | | 1/2019 | |
| CN | 109698206 A | | 4/2019 | |
| CN | 110164916 A | | 8/2019 | |
| CN | 110335953 A | | 10/2019 | |
| CN | 110767841 A | | 2/2020 | |
| CN | 110828695 A | | 2/2020 | |
| CN | 110838509 A | | 2/2020 | |
| CN | 110838559 A | | 2/2020 | |
| CN | 110931540 A | | 3/2020 | |
| CN | 110993806 A | | 4/2020 | |
| CN | 11120008223 A | | 5/2020 | |
| CN | 111584603 A | | 8/2020 | |
| CN | 111785767 A | | 10/2020 | |
| CN | 112186019 A | * | 1/2021 | H01L 23/60 |
| CN | 112216732 A | | 1/2021 | |

OTHER PUBLICATIONS

China Patent Office, CN202011062894.9 First Office Action issued on Mar. 2, 2022.
China Patent Office, CN202180000479.7 First Office Action issued on Jun. 13, 2022.
China Patent Office, CN202180000479.7 Second Office Action issued on Oct. 17, 2022.
WIPO, International Search Report of PCT/CN2021/093421 issued on Aug. 10, 2021.
WIPO, International Search Report of PCT/CN2021/110632 issued on Nov. 3, 2021.
European Patent Office, EP21812847.8 Extended European Search Report, issued on Aug. 28, 2023.
USPTO, Non-Final Office Action, Apr. 24, 2025, corresponding U.S. Appl. No. 17/926,706.
USPTO, Final Office Action, Aug. 1, 2025, corresponding U.S. Appl. No. 17/926,706.

* cited by examiner

DISPLAY PANEL AND DISPLAY DEVICE

CROSS-REFERENCE TO RELATED APPLICATIONS

The present disclosure claims the priority of Chinese patent application No. 202011062894.9, entitled "display panel and display device", filed to Chinese Patent Office on Sep. 30, 2020, and the priority of Chinese patent application No. 202010466036.4, entitled "display substrate and method for manufacturing the same, and display device", filed to Chinese Patent Office on May 28, 2020, the contents of these Chinese patent applications are incorporated herein in their entirety by reference.

TECHNICAL FIELD

The present disclosure relates to the field of display technology, and in particular, to a display panel and a display device.

BACKGROUND

With the rapid development of display technology, mirror display technology is more and more popular with people. A mirror display can realize a display function and can also be used as a mirror, thereby providing great convenience for users. Organic Light Emitting Diode (OLED) display panels are widely applied in the field of mirror display due to their advantages of low energy consumption, low production cost, self-luminescence, wide viewing angle, fast response speed, and the like.

In an OLED mirror display panel, a plurality of opening regions are provided in a mirror reflective layer, the opening regions can transmit light emitted by light emitting devices so as to display an image, and a non-opening region in the mirror reflective layer can be used as a mirror. However, a surface of the display panel may be not flat due to a relatively large step between the opening regions and the non-opening region in the mirror reflective layer, and during a film such as an optical adhesive being attached to the mirror reflective layer, bubbles are easily to be generated between the film and the mirror reflective layer, resulting in a relatively low yield of the display panel.

SUMMARY

An embodiment of the present disclosure provides a display panel, including:
a base substrate;
a plurality of light emitting devices located on the base substrate;
an encapsulation layer covering the light emitting devices;
a mirror layer located on a side of the encapsulation layer away from the base substrate, where the mirror layer includes a plurality of first openings, and an orthographic projection of each first opening on the base substrate overlaps an orthographic projection of at least one of the light emitting devices on the base substrate; and
a transparent filling layer located on a side of the encapsulation layer away from the base substrate,
where at least part of the transparent filling layer is located in the first openings.

In some implementations, the transparent filling layer includes: a first transparent filling layer and a second transparent filling layer, the second transparent filling layer being on a side, away from the base substrate, of the mirror layer;
the first transparent filling layer includes a plurality of filling portions separately provided; and
a part of the filling portions are located in the first openings, and a surface of each filling portion away from the base substrate is substantially flush with a surface of the second transparent filling layer away from the base substrate.

In some implementations, the transparent filling layer includes an organic material.

In some implementations, the transparent filling layer includes a plurality of filling portions separately provided;
the filling portions are located in the first openings, and a surface of each filling portion away from the base substrate is substantially flush with a surface of the mirror layer away from the base substrate.

In some implementations, each filling portion includes an inorganic material.

In some implementations, the transparent filling layer has a transmittance greater than 90%.

In some implementations, the encapsulation layer includes inorganic film layers and an organic film layer stacked;
the organic film layer is located between any two adjacent inorganic film layers;
for the inorganic film layer closest to the mirror layer, a thickness of the inorganic film layer at a position of each first opening is less than that of the inorganic film layer at a position of a pattern of the mirror layer.

In some implementations, a cross-sectional area of each first opening in a direction parallel to the base substrate is gradually increased in a direction from the base substrate to the mirror layer.

In some implementations, the display panel further includes: a pixel defining layer located between the base substrate and the encapsulation layer;
the pixel defining layer includes a plurality of second openings corresponding to the light emitting devices one to one;
the first openings in the mirror layer correspond to the second openings one to one.

In some implementations, an orthographic projection of each second opening on the base substrate is within an orthographic projection of the first opening, corresponding to the second opening, on the base substrate.

In some implementations, the display panel further includes a touch electrode layer located on a side of the transparent filling layer away from the base substrate.

In some implementations, the touch electrode layer includes a plurality of touch electrodes formed by metal meshes;
an orthographic projection of each touch electrode on the base substrate is located in an orthographic projection of a pattern of the pixel defining layer on the base substrate.

In some implementations, the display panel further includes: a touch module located on a side of the transparent filling layer away from the base substrate, and an adhesive layer located between the touch module and the transparent filling layer.

In some implementations, the display panel includes: a plurality of repeating units arranged in an array in a first direction and a second direction, the first direction and the second direction intersect with each other;

each repeating unit includes four sub-pixels including one first sub-pixel, one second sub-pixel, and two third sub-pixels; each sub-pixel is provided with one light emitting device therein;

in each of the repeating units, the first sub-pixel and the second sub-pixel each extend in the first direction and are arranged in the second direction, and the third sub-pixels are located between the first sub-pixel and the second sub-pixel.

In some implementations, the first openings in the mirror layer correspond to the repeating units one to one.

In some implementations, the display panel further includes: a transparent protective layer located between the mirror layer and the encapsulation layer.

In some implementations, the display panel further includes: at least one electrostatic protective portion located on the base substrate and coupled with the mirror layer;
the electrostatic protective portion is configured to release static electricity in the mirror layer;
the display panel has a display area and a peripheral area, the mirror layer is located in the display area, and the electrostatic protective portion is located in the peripheral area.

In some implementations, the electrostatic protective portion includes a conductive connection portion;
the peripheral area is provided with a constant voltage signal terminal, and the conductive connection portion is coupled with the constant voltage signal terminal.

In some implementations, the display panel further includes: a constant voltage signal line located on the base substrate, where
the conductive connection portion is coupled to the constant voltage signal line.

In some implementations, the mirror layer includes a metal material, where
the conductive connection portion and the mirror layer are of an one-piece structure.

In some implementations, the display panel further includes: a first voltage signal terminal and a second voltage signal terminal;
the electrostatic protective portion includes a first transistor and a second transistor, where
a control terminal of the first transistor is coupled to a first terminal of the first transistor, the first terminal of the first transistor is coupled to the first voltage signal terminal, and a second terminal of the first transistor is coupled to a first terminal of the second transistor;
a control terminal of the second transistor is coupled to the first terminal of the second transistor, and a second terminal of the second transistor is coupled to the second voltage signal terminal; and
the mirror layer is coupled to the second terminal of the first transistor.

In some implementations, the display panel includes a plurality of the electrostatic protective portions, and the electrostatic protective portions are uniformly distributed around the mirror layer.

An embodiment of the present disclosure further provides a display panel, including:
a base substrate;
a plurality of light emitting devices on the base substrate;
an encapsulation layer covering the light emitting devices;
a reflective structure layer located on a side of the encapsulation layer away from the base substrate, the reflective structure layer including a plurality of first openings, an orthographic projection of each first opening on the base substrate overlapping an orthographic projection of at least one of the light emitting devices on the base substrate; and
a transparent filling layer located on a side of the encapsulation layer away from the base substrate,
where at least part of the transparent filling layer is located in the first openings.

In some implementations, the transparent filling layer includes a first transparent filling layer and a second transparent filling layer, the second transparent filling layer being on a side, away from the base substrate, of the reflective structure layer;
the first transparent filling layer includes a plurality of filling portions separately provided;
a part of the filling portions are located in the first openings, and a surface of each filling portion away from the base substrate is substantially flush with a surface of the second transparent filling layer away from the base substrate.

In some implementations, the transparent filling layer includes an organic material.

In some implementations, the transparent filling layer includes a plurality of filling portions separately provided;
the filling portions are located in the first openings, and a surface of each filling portion away from the base substrate is substantially flush with a surface of the reflective structure layer away from the base substrate.

In some implementations, each filling portion includes an inorganic material.

In some implementations, the transparent filling layer has a transmittance greater than 90%.

In some implementations, the encapsulation layer includes inorganic film layers and an organic film layer stacked;
the organic film layer is located between any two adjacent inorganic film layers;
for the inorganic film layer closest to the reflective structure layer, a thickness of the inorganic film layer at a position of each first opening is less than that of the inorganic film layer at a position of a pattern of the reflective structure layer.

In some implementations, a cross-sectional area of each first opening in a direction parallel to the base substrate is gradually increased in a direction from the base substrate to the reflective structure layer.

In some implementations, the display panel further includes: a pixel defining layer located between the base substrate and the encapsulation layer;
the pixel defining layer includes a plurality of second openings corresponding to the light emitting devices one to one;
the first openings in the reflective structure layer correspond to the second openings one to one.

In some implementations, an orthographic projection of each second opening on the base substrate is within an orthographic projection of the first opening, corresponding to the second opening, on the base substrate.

In some implementations, the display panel further includes: a transparent protective layer located between the reflective structure layer and the encapsulation layer.

In some implementations, the display panel further including: at least one electrostatic protective portion located on base substrate and coupled with the reflective structure layer;
the electrostatic protective portion is configured to release static electricity in the reflective structure layer;

the display panel has a display area and a peripheral area, the reflective structure layer is located in the display area, and the electrostatic protective portion is located in the peripheral area.

In some implementations, the electrostatic protective portion includes a conductive connection portion;
the peripheral area is provided with a constant voltage signal terminal, and the conductive connection portion is coupled with the constant voltage signal terminal.

In some implementations, the display panel further includes: a constant voltage signal line located on the base substrate, where the conductive connection portion is coupled to the constant voltage signal line.

In some implementations, the reflective structure layer includes a metal material, where the conductive connection portion and the reflective structure layer are formed into one piece (i.e., they are of a one-piece structure).

In some implementations, the display panel further includes: a first voltage signal terminal and a second voltage signal terminal;
the electrostatic protective portion includes a first transistor and a second transistor, where
a control terminal of the first transistor is coupled to a first terminal of the first transistor, the first terminal of the first transistor is coupled to the first voltage signal terminal, and a second terminal of the first transistor is coupled to a first terminal of the second transistor;
a control terminal of the second transistor is coupled to the first terminal of the second transistor, and a second terminal of the second transistor is coupled to the second voltage signal terminal; and
the reflective structure layer is coupled to the second terminal of the first transistor.

In some implementations, the display panel includes a plurality of the electrostatic protective portions, and the electrostatic protective portions are uniformly distributed around the reflective structure layer.

An embodiment of the present disclosure further provides a display device, including: any one of display panels described above.

DETAILED DESCRIPTION

Figure 1:
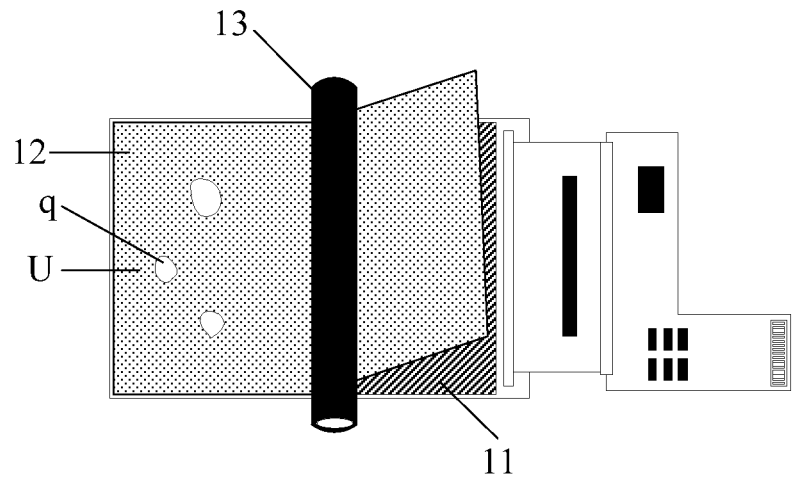
FIG. 1 is a schematic structural diagram of an OLED mirror display panel being manufactured in the related art.

FIG. 1 is a schematic structural diagram of an OLED mirror display panel being manufactured in the related art, and referring to FIG. 1, in a process of manufacturing the OLED mirror display panel, a light emitting device is encapsulated by using an encapsulation layer, a mirror reflective layer 11 is formed above the encapsulation layer, and the mirror reflective layer 11 is patterned to form a plurality of opening regions U. For a clearer illustration, four opening regions U are illustrated in FIG. 1, and a shape, a size and the number of the opening regions U are not limited. Light emitted from the light emitting device can exit out through the opening region U of the mirror reflective layer 11 so as to display an image, and a non-opening region in the mirror reflective layer 11 may serve as a mirror.

After the mirror reflective layer 11 is manufactured, film layers such as an optical adhesive 12 and a cover plate may be attached to a surface of the mirror reflective layer 11, for example, in a process of attaching the optical adhesive 12, the optical adhesive 12 may be spread by using a roller 13. Since the mirror reflective layer 11 has the opening regions U therein, a step between the opening regions U and the non-opening region is relatively large, resulting in an uneven surface of the display panel. During the process of attaching the optical adhesive 12, air may be remained in the opening regions U, so that wrinkles may appear in a surface of the optical adhesive 12 after the optical adhesive 12 is attached. Moreover, due to edges of the opening regions U supporting the optical adhesive 12, the optical adhesive 12 is suspended at the opening regions U, so that the display panel is easily to be deformed during a finger pressing a surface of the display panel. In addition, in a subsequent reliability test, bubbles q are likely to appear in the surface of the display panel under a relatively high-temperature and high-humidity environment, which affects a yield of display.

In view of above, embodiments of the present disclosure provide a display panel and a display device.

Implementations of the display panel and the display device according to the embodiments of the present disclosure will be described in detail below with reference to the accompanying drawings. Thicknesses and shapes of various film layers in the drawings do not reflect true proportion, and are only intended to illustrate contents of the present disclosure.

Figure 2:
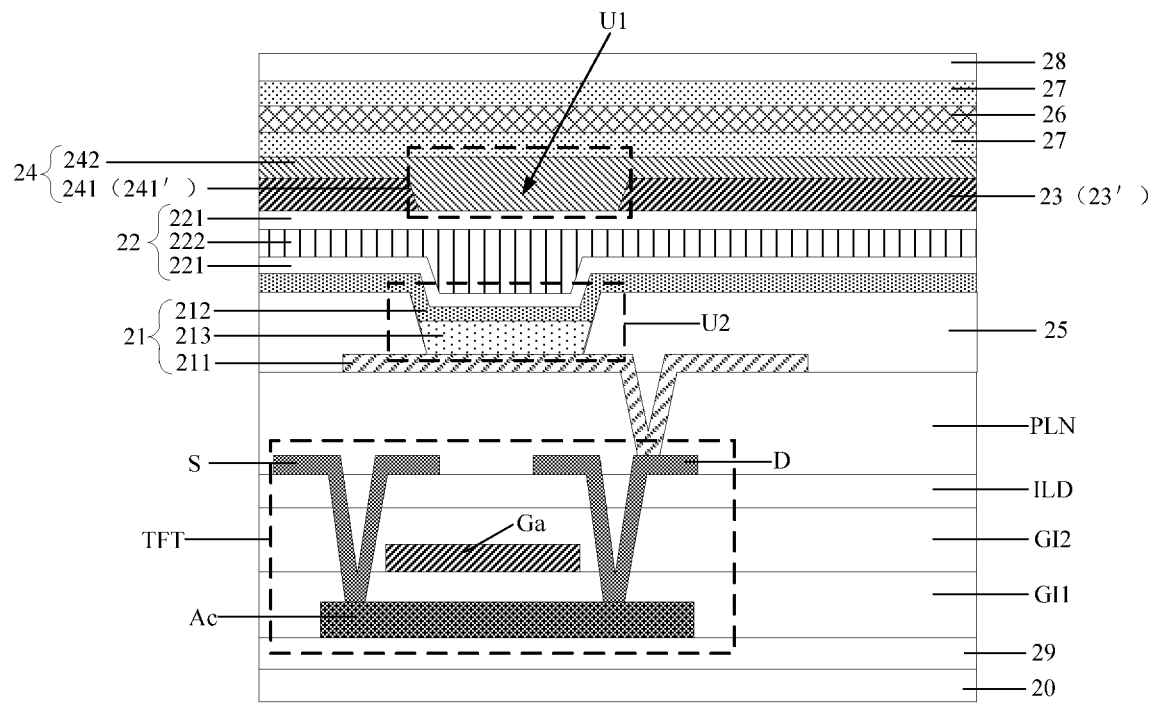
FIG. 2 is a schematic structural diagram of a display panel according to an embodiment of the present disclosure.

FIG. 2 is a schematic structural diagram of the display panel provided in an embodiment of the present disclosure, and as shown in FIG. 2, the display panel provided in the embodiment of the present disclosure may include: a base substrate 20; a plurality of light emitting devices 21 located on the base substrate 20; an encapsulation layer 22 covering the light emitting devices 21; a mirror layer 23 located on a side of the encapsulation layer 22 away from the base substrate 20, the mirror layer 23 including a plurality of first openings U1, an orthographic projection of each first opening U1 on the base substrate 20 overlapping an orthographic projection of at least one of the light emitting devices 21 on the base substrate 20; and a transparent filling layer 24 located on a side of the encapsulation layer 22 away from the base substrate 20, where at least part of the transparent filling layer 24 is located in the first openings U1 in the mirror layer 23.

In the display panel provided by the embodiment of the present disclosure, the transparent filling layer is arranged on the side of the encapsulation layer away from the base substrate, and at least part of the transparent filling layer is arranged in the first openings in the mirror layer, so that the step between the first openings and the non-opening region in the mirror layer is reduced, and the surface of the display panel is relatively flat, therefore, during film layers such as an adhesive layer (for example, an optical adhesive) and a cover plate being attached on the mirror layer in subsequent processes, defects such as wrinkles or bubbles are not easy to occur in superficial film layers (such as the adhesive layer) of the display panel, and the yield of display of the display panel is improved.

The display panel provided in the embodiment of the present disclosure may be an organic light emitting diode display panel, referring to FIG. 2, the display panel in the embodiment of the present disclosure may include a plurality of light emitting devices 21, in order to clearly illustrate structures of film layers in the embodiment of the present disclosure, only one light emitting device 21 is shown in FIG. 2, and in practices, the number and distribution of the light emitting devices 21 may be set according to practical expections, which is not limited herein. Each light emitting device 21 may include: a first electrode 211, a second electrode 212 located on a side of the first electrode 211 away from the base substrate 20, and an organic light emitting layer 213 located between the first electrode 211 and the second electrode 212; the first electrode 211 is an anode, and the second electrode 212 is a cathode; alternatively, the first electrode 211 is a cathode and the second electrode 212 is an anode. In some implementations, first electrodes 211 of the light emitting devices 21 may be separately provided, that is, each light emitting device 21 may have a separated or independent first electrode 211, and the light emitting devices 21 may share one second electrode 212, that is, second electrodes 212 of the light emitting devices 21 may be formed into one piece, i.e., formed into an entire electrode in a full surface.

With continued reference to FIG. 2, the display panel provided in the embodiment of the present disclosure may further include the encapsulation layer 22 located on a side of the light emitting devices 21 away from the base substrate 20, and the encapsulation layer 22 covers the light emitting devices 21 in the display panel to prevent the light emitting devices 21 from being corroded by moisture and oxygen.

In the embodiment of the present disclosure, as shown in FIG. 2, by providing the mirror layer 23 on the side of the encapsulation layer 22 away from the base substrate 20, a distance between the mirror layer 23 and a display surface of the display panel is relatively short, a good mirror effect can be achieved. The mirror layer 23 includes the plurality of first openings U1, and the orthogonal projection of each first opening U1 on the base substrate 20 overlaps the orthogonal projection of at least one of the light emitting devices 21 on the base substrate 20, so that light emitted from the light emitting devices 21 can be emitted through the first openings U1 so as to display an image. A region (i.e., non-opening region) of the mirror layer 23 other than the first openings U1 can reflect light, and thus, the non-opening region of the mirror layer 23 can be used as a mirror. Therefore, the display panel can simultaneously realize functions of display and mirror, and a user can watch an image reflected by the display panel while watching the image displayed by the display panel, thereby meeting various requirements of the user. The display panel provided by the embodiment of the present disclosure may be applied to various scenes, for example, the display panel may be applied to scenes such as an advertisement screen in a public place, a vehicle-mounted rearview mirror and a display screen of a cash dispenser. In addition, external light cannot pass through the mirror layer 23 to reach inside of the display panel, and thus light emitted from the light emitting devices 21 is not affected by the external light, which improves a contrast of the display panel.

In practical applications, with continued reference to FIG. 2, the mirror layer 23 may be made of a metal material with a relatively high reflectivity, for example, the mirror layer 23 may be made of aluminum or silver, furthermore, the mirror layer 23 may include at least two metal layers stacked together, for example, the mirror layer 23 may include metal layers of titanium/aluminum/titanium. In a practical process, a metal layer may be deposited on the encapsulation layer 22 by a low temperature sputtering process, and then the metal layer is patterned by a patterning process to form the mirror layer 23 with the first openings U1. Certainly, the mirror layer 23 may also be made of any other material with a relatively high reflectivity, which is not limited herein. In some implementations, the mirror layer 23 may have a thickness in a range from 200 nm to 500 nm, or in a range from 200 nm to 350 nm, for example, the mirror layer 23 may have a thickness of about 310 nm.

Figure 3:
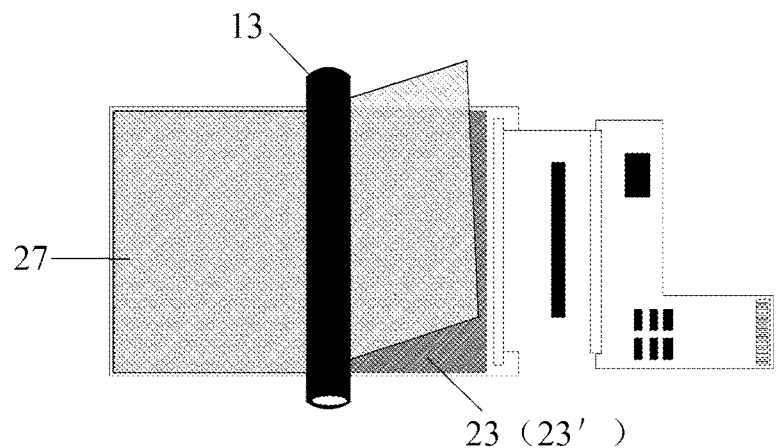
FIG. 3 is a schematic structural diagram of a display panel being manufactured according to an embodiment of the present disclosure.

FIG. 3 is a schematic structural diagram of a display panel being manufactured according to the embodiment of the present disclosure, and with reference to FIG. 2 and FIG. 3, in the embodiment of the present disclosure, by providing the transparent filling layer 24 on the side of the encapsulation layer 22 away from the base substrate 20 and providing at least part of the transparent filling layer 24 in the first openings U1 in the mirror layer 23, a step between the first openings U1 and the non-opening region in the mirror layer 23 is reduced, so that the surface of the display panel is relatively flat. During a film layer such as an adhesive layer 27 being subsequently attached to a surface of the mirror layer 23, defects such as wrinkles or bubbles are less likely to occur in the film layer such as the adhesive layer 27. As shown in FIG. 3, the adhesive layer 27 may be spread by the roller 13, and as is apparent from FIG. 3, a surface of the adhesive layer 27 is relatively flat and does not have defects such as wrinkles or bubbles therein.

In addition, as shown in FIG. 2, since the transparent filling layer 24 is transparent, the light emitted from the light emitting device 21 can pass through the transparent filling layer 24, and thus a display effect of the display panel is not affected by the transparent filling layer 24.

In the embodiment of the present disclosure, the transparent filling layer may be implemented by at least two ways, which are described in detail below with reference to the accompanying drawings.

The first way of implementing the transparent filling layer is as follows.

As shown in FIG. 2, in the display panel provided in the embodiment of the present disclosure, the transparent filling layer 24 may include a first transparent filling layer 241 and a second transparent filling layer 242, the second transparent filling layer 242 is located on the side of the mirror layer 23 away from the base substrate 20; the first transparent filling layer 241 may include a plurality of filling portions 241' separately provided, only one filling portion 241' is illustrated in the figure for clearly illustrating the structure of the transparent filling layer 24, and in practical applications, the filling portions 241' may be provided at positions of the first openings U1; a part of the filling portions 241' are located in the first openings U1, and a surface of each filling portion 241' away from the base substrate 20 is substantially flush with a surface of the second transparent filling layer 242 away from the base substrate 20, which means that a distance between the surface of each filling portion 241' away from the base substrate 20 and the surface of the second transparent filling layer 242 away from the base substrate 20 may be within a certain deviation range, for example, the distance may be less than 30 nm, that is, the surface of the transparent filling layer 24 away from the base substrate 20 is substantially flat and may fluctuate within a range less than 30 nm.

In the embodiment of the present disclosure, the first transparent filling layer 241 includes a plurality of filling portions 241', and the filling portions 241' may fill the first openings U1, in some implementations, the plurality of filling portions 241' in the first transparent filling layer 241 may correspond to the plurality of first openings U1 in the mirror layer 23 one to one, so that each of the first openings U1 in the mirror layer 23 is filled by the transparent filling layer 24, and a thickness of each filling portion 241' in a direction perpendicular to the base substrate 20 may be the same as a total thickness of the mirror layer 23 and the second transparent filling layer 242 in the direction perpendicular to the base substrate 20, so that the filling effect of the filling portions 241' is better, and the surface of the transparent filling layer 24 away from the base substrate 20 is a flat surface, so that the transparent filling layer 24 may also play a role of flattening, and thus the surface of the display panel is more flat. In addition, the transparent filling layer 24 can also protect the mirror layer 23, that is, prevent the surface of the mirror layer 23 from being damaged by a subsequent process.

In some implementations, with continued reference to FIG. 2, in the display panel provided in the embodiment of the present disclosure, the transparent filling layer 24 may include an organic material, for example, may include a resin material. In some implementations, the first transparent filling layer 241 and the second transparent filling layer 242 in the transparent filling layer 24 may be formed into one piece, so that the transparent filling layer 24 is easier to be manufactured. In a process of manufacturing the transparent filling layer 24, an organic material is coated on the mirror layer 23, since the organic material can achieve a better leveling effect and can fill each of the first openings U1 in the mirror layer 23, and can cover the non-opening region of the mirror layer 23, so as to form the transparent filling layer 24. Moreover, the organic material can achieve a good flattening effect, so that the surface of the transparent filling layer 24 away from the base substrate 20 is a flat surface.

in some implementations a thickness of the first transparent filling layer 241 may be in a range from 200 nm to 1000 nm, or in a range from 300 nm to 600 nm, for example, the thickness of the first transparent filling layer 241 may be about 560 nm, a thickness of the second transparent filling layer 242 may be in a range from 200 nm to 400 nm, and for example, the thickness of the second transparent filling layer 242 may be about 310 nm.

The second way of implementing the transparent filling layer is as follows.

Figure 4:
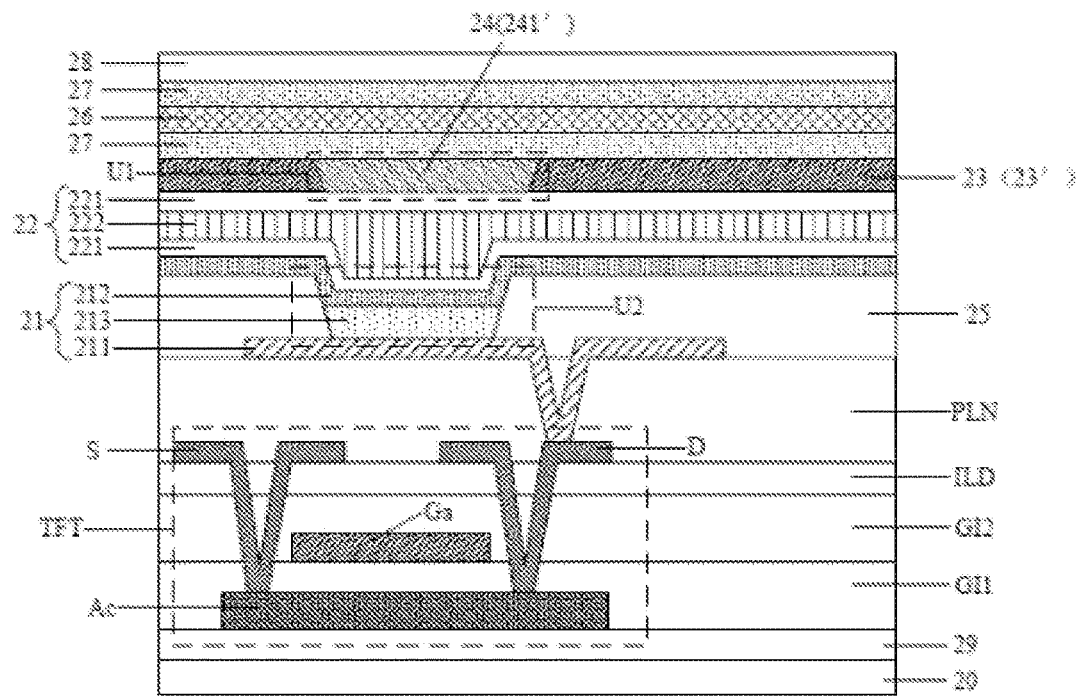
FIG. 4 is a schematic structural diagram of a display panel according to an embodiment of the present disclosure.

FIG. 4 is another schematic structural diagram of the display panel provided in the embodiment of the present disclosure, and as shown in FIG. 4, in the display panel provided in the embodiment of the present disclosure, the transparent filling layer 24 may include: a plurality of filling portions 241' separately provided; the filling portions 241' are located in the first openings U1, respectively, and a surface of each filling portion 241' away from the base substrate 20 is substantially flush with the surface of the mirror layer 23 away from the base substrate 20, which means that a distance between the surface of each filling portion 241' away from the base substrate 20 and the surface of the mirror layer 23 away from the base substrate 20 may be within a certain deviation range, for example, the distance may be less than 30 nm.

In the embodiment of the present disclosure, the transparent filling layer 24 may include the plurality of filling portions 241' separately provided, and the filling portions 241' may fill the first openings U1, respectively. In some implementations, the plurality of filling portions 241' in the transparent filling layer 24 may correspond to the plurality of first openings U1 in the mirror layer 23 one to one, so that each first opening U1 in the mirror layer 23 is filled by the transparent filling layer 24. The surface of each filling portion 241' away from the base substrate 20 is substantially flush with the surface of the mirror layer 23 away from the base substrate 20, so that the surface of the mirror layer 23 away from the base substrate 20 is relatively flat. In an implementation, the thickness of each filling portion 241' may be determined according to the thickness of the mirror layer 23, so that the filling portions 241' can fill and level up the first openings U1.

In an implementation, in the display panel provided in the embodiment of the present disclosure, with continued reference to FIG. 4, the filling portions 241' may include an inorganic material, for example, a silicon dioxide material or a silicon nitride material. In the process of manufacturing the filling portions 241', an inorganic layer having a thickness the same as the thickness of the mirror layer 23 is deposited on the mirror layer 23 by using a chemical vapor deposition process, and then the inorganic layer is patterned by using a patterning process to remove the inorganic layer in the non-opening region, so as to form the plurality of filling portions 241' in the first openings U1.

In a practical application, in the display panel provided by the embodiment of the disclosure, the transmittance of the transparent filling layer is greater than 90%, and the transparent filling layer is made of a material with a relatively high transmittance, so that light emitted by the light emitting device can pass through the transparent filling layer, and the display effect of the display panel cannot be influenced by the transparent filling layer. Certainly, the transmittance of the transparent filling layer may also be less than 90%, and may be set according to practical expections, which is not limited herein.

Figure 5:
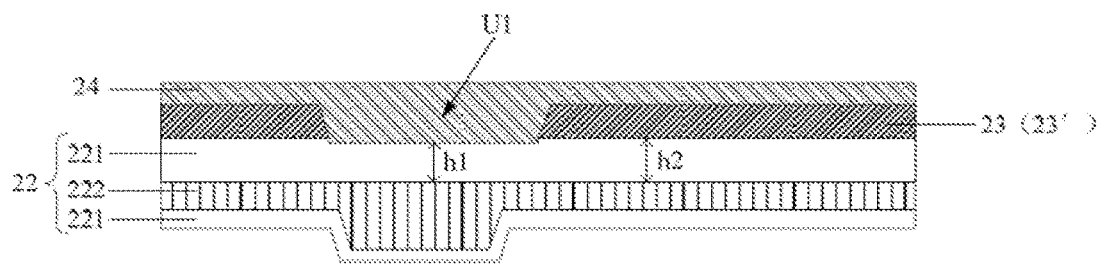
FIG. 5 is a partially enlarged schematic diagram of a structure of FIG. 2.

FIG. 5 is a partially enlarged view of a structure in FIG. 2, and for clarity of illustrating the structure of the encapsulation layer, only the encapsulation layer, the mirror layer and the transparent filling layer are shown in FIG. 5, and other film layers are omitted. As shown in FIGS. 2 and 5, the encapsulation layer 22 may include inorganic film layers 221 and an organic film layer 222 which are stacked, the inorganic film layers 221 can block moisture and oxygen, and the organic film layer 222 may be located between any two adjacent inorganic film layers 221, and can play roles of releasing stress and flattening. For the inorganic film layer 221 closest to the mirror layer 23, a thickness h1 of the inorganic film layer 221 at a position of the first opening U1 is less than a thickness h2 of the inorganic film layer 221 at a position of a pattern of the mirror layer 23, that is, the thickness h1 of the inorganic film layer 221 at a position of the light emitting device 21 is relatively small, so that the inorganic film layer 221 has less influence on the light emitted from the light emitting device 21, and the light transmittance of the display panel can be improved. In a practical process, process parameters for forming the mirror layer 23 may be adjusted, and during etching the mirror layer 23, an overetching may occur at the positions of the first openings U1, so that the thickness h1 of the inorganic film layer 221 at the position of the light emitting device 21 is relatively small. In some implementations, a total thickness of the encapsulation layer 22 may be in a range from 500 nm to 800 nm, a thickness of the encapsulation layer 22 at the position of the first opening U1 may be about 540 nm, and a thickness of the encapsulation layer 22 at the position of the pattern of the mirror layer 23 may be about 610 nm.

In order to clearly illustrate a structure of the inorganic film layer 221 closest to the mirror layer 23, in FIG. 5, the thickness of the inorganic film layer 221 is illustrated as being relatively large, and in an implementation, the thickness of each inorganic film layer 221 in the encapsulation layer 22 may be set according to practical expections, which is not limited herein. In addition, FIG. 5 illustrates an example in which the transparent filling layer 24 is implemented by the above first way, and for the transparent filling layer 24 implemented by the above second way, the inorganic film layer 221 closest to the mirror layer 23 may be provided so that the thickness h1 of the inorganic film layer 221 at the position of each first opening U1 is less than the thickness h2 of the inorganic film layer 221 at the position of the pattern of the mirror layer 23.

In an implementation, as shown in FIGS. 2 and 4, in the display panel provided by the embodiment of the present disclosure, in a direction from the base substrate 20 to the mirror layer 23, a cross-sectional area of each first opening U1 in a direction parallel to the base substrate 20 is gradually increased, that is, a side wall of each first opening U1 is formed with an inclined surface, so that the light emitted from the light emitting device 21 can be reflected by the side wall of the first opening U1 and then emitted, and light extraction efficiency of the display panel is improved.

As shown in FIG. 2, the display panel provided in the embodiment of the present disclosure may further include a pixel defining layer 25 located between the base substrate 20 and the encapsulation layer 22, the pixel defining layer 25 may include a plurality of second openings U2 corresponding to the light emitting devices 21 one to one, and the plurality of first openings U1 in the mirror layer 23 correspond to the second openings U2 one to one.

In the embodiment of the present disclosure, the display panel may include a plurality of sub-pixels, and the pixel defining layer is configured to define an area of each sub-pixel, that is, a position of each second opening U2 corresponds to one sub-pixel. The plurality of first openings U1 in the mirror layer 23 correspond to the second openings U2 one to one, so that on one hand, it can be ensured that light emitted from each light emitting device 21 can pass through the first opening U1 corresponding to the light emitting device, and thus it is ensured that the display panel has a good display effect, and on the other hand, an area of the non-opening region of the mirror layer 23 may be made larger, and the mirror effect of the display panel is made better.

Figure 6:
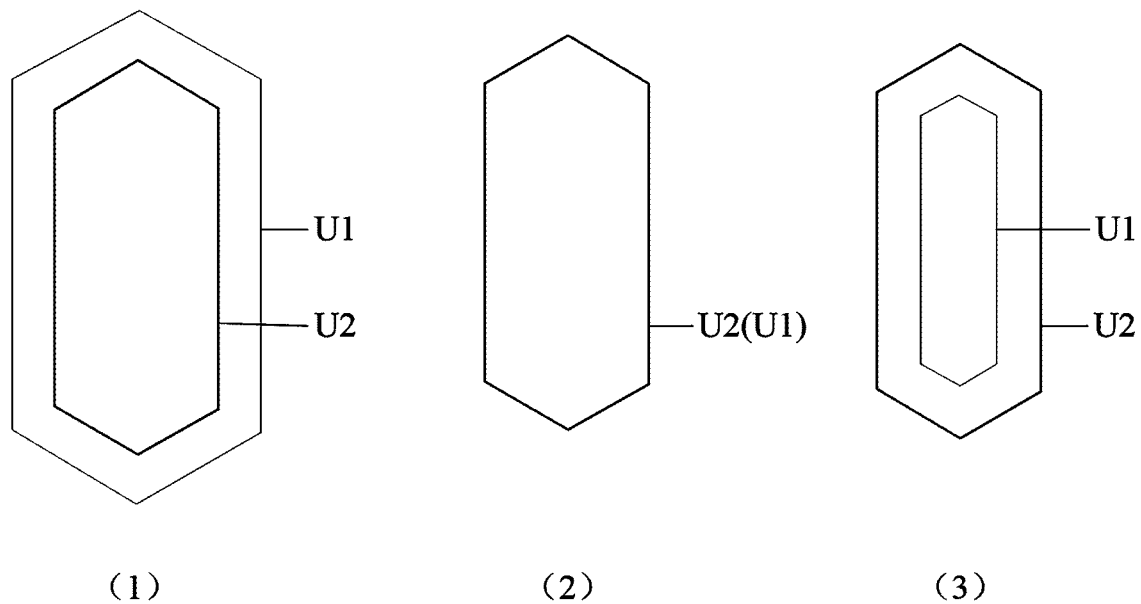
FIG. 6 is a schematic diagram illustrating a corresponding relationship between a first opening and a second opening according to an embodiment of the present disclosure.

FIG. 6 is a schematic diagram illustrating a corresponding relationship between the first openings and the second openings in the embodiment of the present disclosure, as shown in (1) and (2) of FIG. 6, in the display panel provided in the embodiment of the present disclosure, an orthographic projection of each second opening U2 on the base substrate is located within the orthographic projection of the first opening U1, corresponding to the second opening, on the base substrate, that is, a size of each first opening U1 in the mirror layer is larger than a size of the second opening U2 corresponding to the first opening U1, or the size of each first opening U1 in the mirror layer is equivalent to the size of the second opening U2 corresponding to the first opening U1, so that light emitted from each light emitting device can not be blocked by the mirror layer, and thus the mirror layer does not affect an aperture ratio of the display panel, and a display effect of the display panel is good.

In addition, as shown in (3) in FIG. 6, the orthographic projection of each first opening U1 on the base substrate may also be set to be within the orthographic projection of the second opening U2, corresponding to the first opening U1, on the base substrate, that is, the size of each first opening U1 in the mirror layer is less than the size of the second opening U2 corresponding to the first opening U1, so that although an edge of each first opening U1 in the mirror layer may block part of the light emitted from the light emitting device, the reflectivity of the display panel may be improved, that is, the mirror effect of the display panel may be improved.

In an implementation, a shape of each first opening U1 may be the same as that of each second opening U2, for example, in FIG. 6, both shapes of each first opening U1 and each second opening U2 are hexagonal, and in an implementation, each first opening U1 and each second opening U2 may be of other shapes, which is not limited herein.

Figure 7:
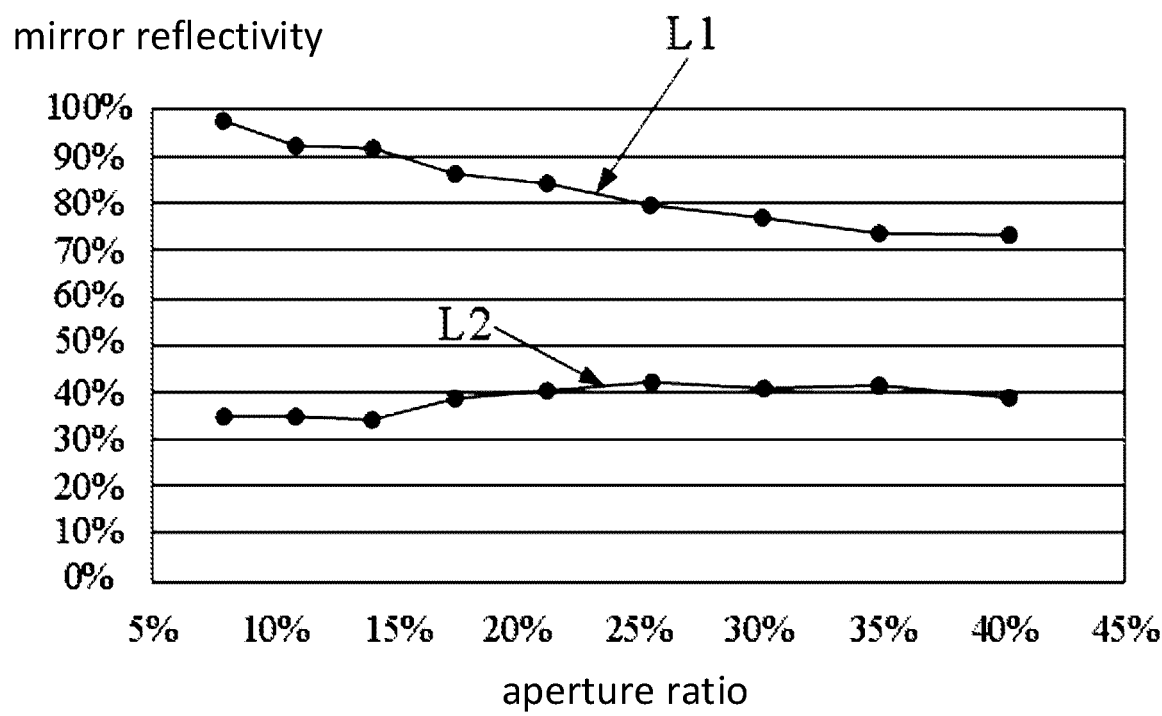
FIG. 7 is a schematic diagram illustrating a corresponding relationship between an aperture ratio of a mirror layer and a mirror reflectivity (specular reflectance) of a display panel.

FIG. 7 is a schematic diagram illustrating a corresponding relationship between an aperture ratio of the mirror layer and a mirror reflectivity of a display panel, as shown in FIG. 7, a curve L1 illustrates the corresponding relationship between the aperture ratio of the mirror layer and the mirror reflectivity of the display panel with the mirror layer, and a curve L2 illustrates the mirror reflectivity of the display panel without the mirror layer. It should be understood that the aperture ratio of the mirror layer refers to a ratio of a total area of the first openings in the mirror layer to a total area of sub-pixels corresponding to the first openings. As can be seen from FIG. 7, for the display panel with the mirror layer, as the aperture ratio of the mirror layer increases, a total area of the first openings in the mirror layer increases, a total area of the non-opening region of the mirror layer decreases, and thus the mirror reflectivity of the display panel gradually decreases. For the display panel without the mirror layer, the mirror reflectivity of the display panel is relatively low.

In practical applications, a test light source and a luminance meter may be used for detecting the mirror reflectivity of the display panel, for example, the test light source and the luminance meter may be arranged at a preset position on a side at the display surface of the display panel, so that light emitted from the test light source can be emitted to the display surface of the display panel and reflected to the luminance meter by the display surface of the display panel, and the mirror reflectivity of the display panel can be determined according to a luminance of light emitted from the test light source and a luminance detected by the luminance meter. In an implementation, the mirror reflectivity of the display panel may be set to be larger than 50%, for example, the mirror reflectivity may be set to be in a range from 85% to 97%, the transmittance of the display panel is set to be in a range from 46% to 81%, and the size of each first opening in the mirror layer may be set according to a practical scene, namely according to a magnitude of the mirror reflectivity desired by the display panel.

An aperture ratio of the pixel defining layer may be in a range from 15% to 30%, or in a range from 20% to 26%, for example, the aperture ratio of the pixel defining layer may be set to about 21%, and the aperture ratio of the pixel defining layer may be understood as a ratio of a total area of the second openings in the pixel defining layer to a total area of sub-pixels corresponding to the second openings. A width of each second opening in the pixel defining layer may be set in a range from 8 μm to 25 μm, or in a range from 10 μm to 20 μm, for example, the width of each second opening may be set to about 15 μm, and a width of each first opening in the mirror layer may be set in a range from 7 μm to 23 μm. In an implementation, a ratio of an area of each first opening to an area of each second opening may be set in a range from 0.38 to 1.89.

In a practical application, as shown in FIG. 2, in order to drive each light emitting device 21 to emit light, the display panel may further include: a thin film transistor TFT, a capacitor (not shown) and the like, the thin film transistor TFT may include an active layer Ac, a source S, a drain D, and a gate Ga, and the drain D of the thin film transistor TFT is coupled to the first electrode 211. In order to insulate conductive members in different film layers from each other, the display panel may further include: a first gate insulating layer GI1 located between the active layer Ac and the gate Ga, a second gate insulating layer GI2 and an interlayer insulating layer ILD between the gate Ga and the source S, a planarization layer PLN located between the source S and the first electrode 211, and a buffer layer 29 located between the active layer Ac and the base substrate 20. In addition, the display panel may further include a passivation layer (not shown) located between the source S and the planarization layer PLN to protect the source S and the drain D from being oxidized.

Figure 8:
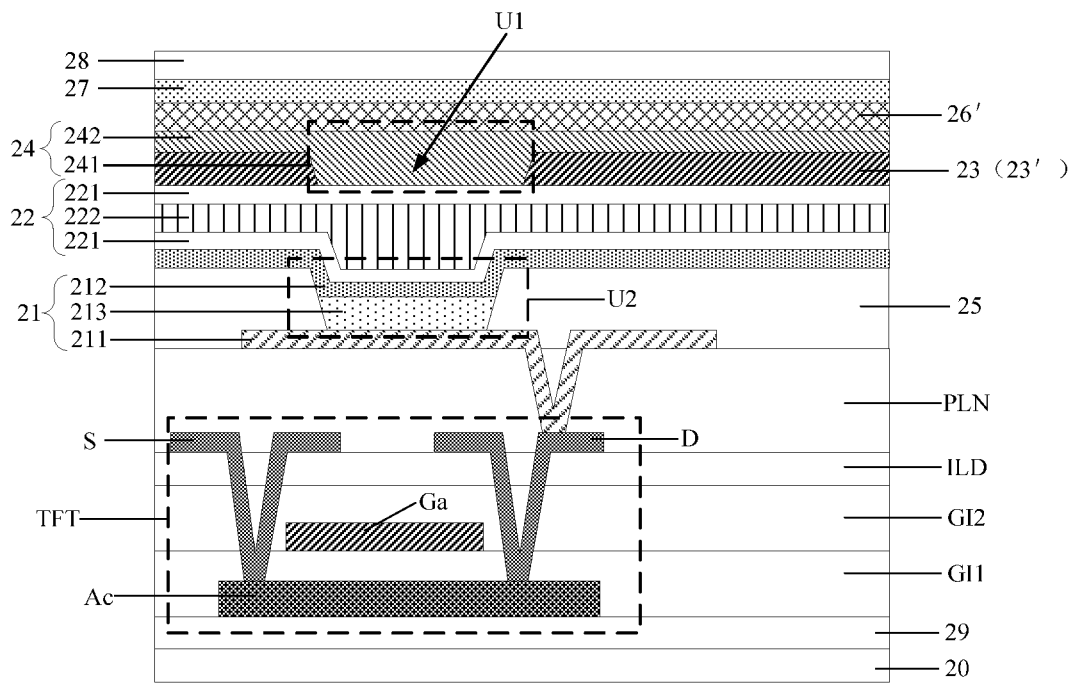
FIG. 8 is a schematic structural diagram of a display panel according to an embodiment of the present disclosure.

FIG. 8 is another schematic structural diagram of the display panel provided in the embodiment of the present disclosure, and as shown in FIG. 8, the display panel provided in the embodiment of the present disclosure may further include: a touch electrode layer 26' formed on a side, away from the base substrate 20, of the transparent filling layer 24. In such way, the display panel can realize a touch function, and the touch electrode layer 26' is close to the display surface of the display panel, thus the touch effect of the display panel is better. In a practical process, the touch electrode layer 26' may be formed directly on the transparent filling layer 24, and a patterning process may be performed on the touch electrode layer 26' to form a plurality of touch electrodes. In addition, the display panel may further include a cover plate 28, and an adhesive layer 27 between the cover plate 28 and the touch electrode layer 26'. The cover plate 28 can protect structures inside the display panel, and the adhesive layer 27 can adhere the cover plate 28 to the surface of the touch electrode layer 26'.

Figure 9:
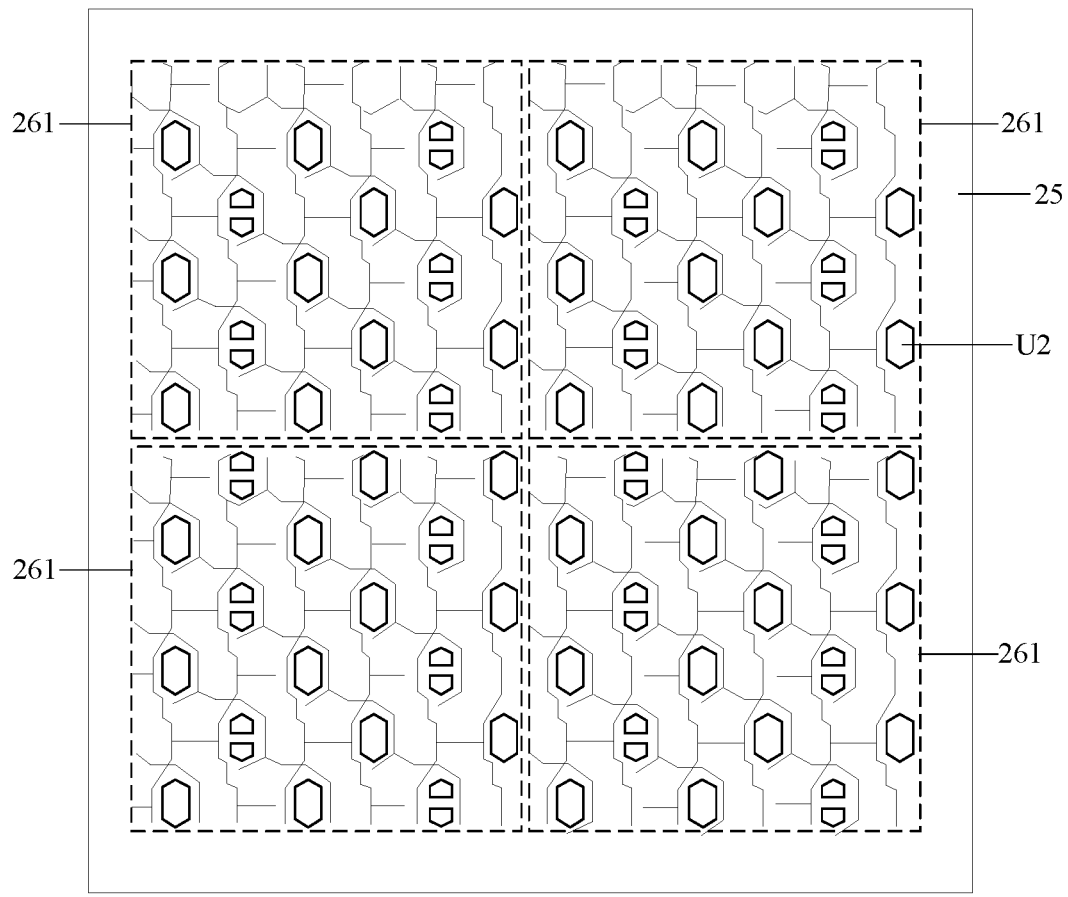
FIG. 9 is a schematic top view of a structure of a display panel according to an embodiment of the present disclosure.

FIG. 9 is a schematic top view of a structure of the display panel provided in the embodiment of the present disclosure, and as shown in FIG. 9, in the display panel provided in the embodiment of the present disclosure, the touch electrode layer may include a plurality of touch electrodes 261 made of metal meshes; an orthographic projection of each touch electrode 261 on the base substrate is located within an orthographic projection of a pattern of the pixel defining layer 25 on the base substrate, that is, an orthographic projection of the metal mesh in each touch electrode 261 on the base substrate does not overlap the orthographic projection of each second opening U2 in the pixel defining layer 25 on the base substrate.

With such arrangement, the touch electrode can not block the light emitted from each light emitting device, and the display effect of the display panel can not be influenced.

As shown in FIG. 2, in some implementations, the display panel may further include a touch module 26 located on a side of the transparent filling layer 24 away from the base substrate 20, and an adhesive layer 27 located between the touch module 26 and the transparent filling layer 24, for example, the adhesive layer 27 may be made of an optical adhesive. In a practical process, the adhesive layer 27 may be attached to the surface of the transparent filling layer 24, then the touch module 26 is attached to a surface of the adhesive layer 27, so that the touch module 26 is attached to the surface of the transparent filling layer 24 through the adhesive layer 27. In the embodiment of the present disclosure, since at least a part of the transparent filling layer 24 is provided in the first openings U1 in the mirror layer 23, defects such as wrinkles or bubbles can be prevented from occurring in the adhesive layer 27 formed on the transparent filling layer 24, and the yield of the display panel is relatively high.

In some implementations, the touch module 26 may include a plurality of touch electrodes, and the touch electrodes may be made of a transparent conductive material, for example, may be made of an Indium Tin Oxide (ITO) material, so that the touch module can not block light emitted from each light emitting device, and can not affect the display effect of the display panel.

In addition, with continued reference to FIG. 2, the display panel provided in the embodiment of the present disclosure may further include the cover plate 28, and the adhesive layer 27 located between the cover plate 28 and the touch module 26. The cover plate 28 can protect structures inside the display panel, and the adhesive layer 27 can adhere the cover plate 28 to the surface of the touch module 26.

Figure 10:
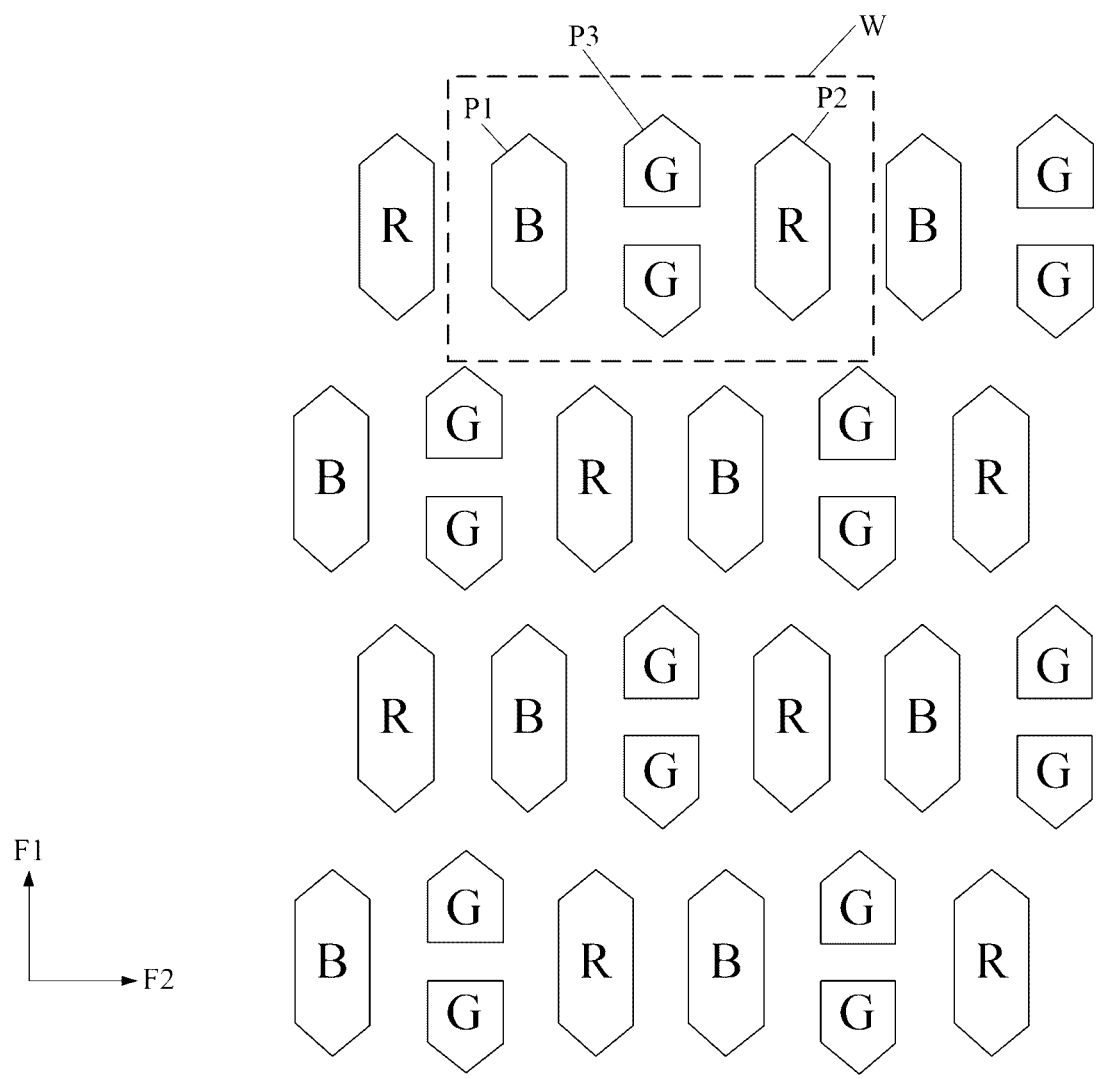
FIG. 10 is a schematic diagram of an arrangement of pixels of a display panel according to an embodiment of the present disclosure.

FIG. 10 is a schematic diagram of an arrangement of pixels of the display panel provided in the embodiment of the present disclosure, and as shown in FIG. 10, the display panel provided in the embodiment of the present disclosure may include: a plurality of repeating units W arranged in an array in a first direction F1 and a second direction F2; the first direction F1 and the second direction F2 intersect with each other, for example, the first direction F1 and the second direction F2 may be perpendicular to each other; each repeating unit W may include four sub-pixels, i.e., one first sub-pixel P1, one second sub-pixel P2, and two third sub-pixels P3, each sub-pixel is provided with a light emitting device therein; in each repeating unit W, the first sub-pixel P1 and the second sub-pixel P2 each extend in the first direction F1 and are arranged in the second direction F2, and the third sub-pixels P3 are located between the first sub-pixel P1 and the second sub-pixel P2. In some implementations, the first sub-pixel P1 may be a blue sub-pixel, the second sub-pixel P2 may be a red sub-pixel, and each third sub-pixel P3 may be a green sub-pixel, and in an implementation, the color of each sub-pixel may be adjusted according to a practical expection, and a color of each sub-pixel is not limited herein. In a practical application, the sub-pixels in a same repeating unit W may correspond to one display pixel, or the sub-pixels in different repeating units W may correspond to one display pixel, which may be set according to practical display expections, and is not limited herein.

In some implementations, in each repeating unit W, the first sub-pixel P1 and the second sub-pixel P2 each may be hexagonal, the third sub-pixels P3 each may be pentagonal, or the first sub-pixel P1, the second sub-pixel P2 and the third sub-pixels P3 may be of other shapes, which is not limited herein. In the embodiment of the present disclosure, a shape of each second opening in the pixel defining layer may be the same as the shape of the sub-pixel corresponding to second opening, and in an implementation, the shape of each second opening may be set according to the shape of the sub-pixel corresponding to the second opening.

In practical applications, in the display panel provided by the embodiment of the disclosure, the plurality of first openings in the mirror layer correspond to the repeating units one to one. In such way, the mirror layer can not block the light emitted from each sub-pixel in the repeating unit, and the display effect of the display panel is better.

Figure 11:
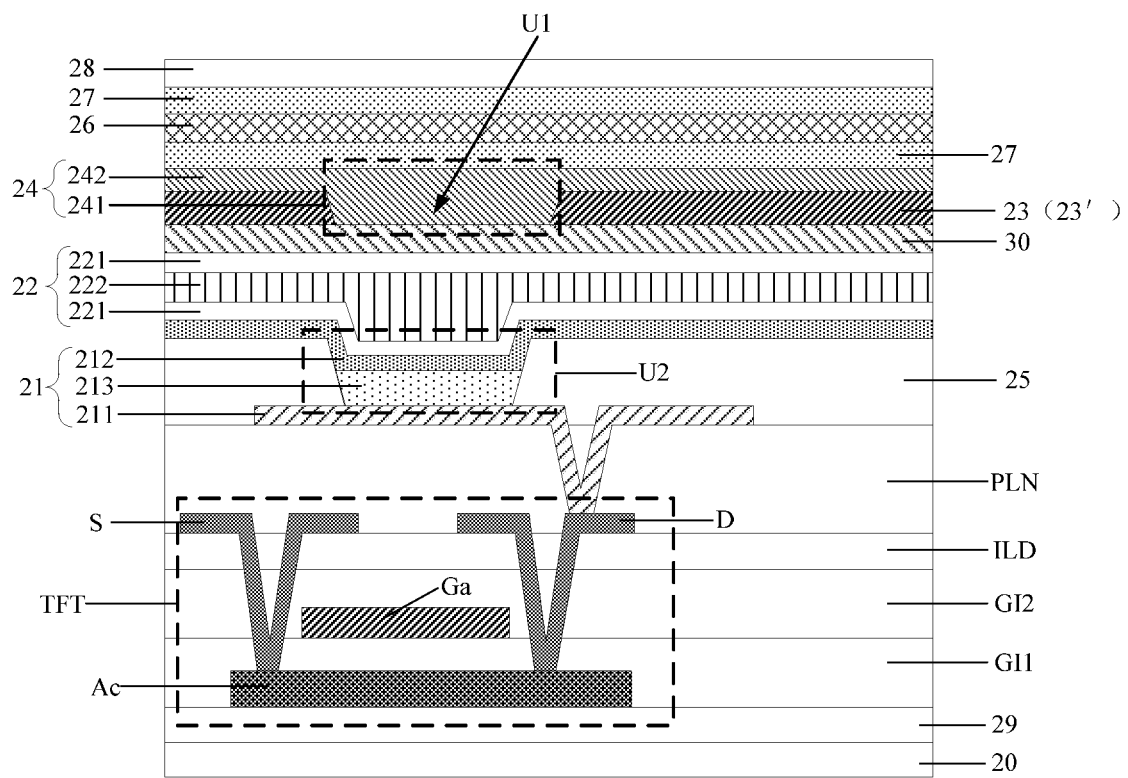
FIG. 11 is a schematic structural diagram of a display panel according to an embodiment of the present disclosure.

FIG. 11 is another schematic structural diagram of the display panel provided in the embodiment of the present disclosure, and as shown in FIG. 11, the display panel provided in the embodiment of the present disclosure may further include a transparent protective layer 30 between the mirror layer 23 and the encapsulation layer 22. In the process of manufacturing the display panel, the transparent protective layer 30 can protect a film layer therebelow from being damaged in the process of patterning the mirror layer 23, and the light emitted from each light emitting device 21 can pass through the transparent protective layer 30, so that the display effect of the display panel cannot be influenced. In an implementation, at an edge of the display panel, an edge of the transparent protective layer may exceed edges of the encapsulation layer and the mirror layer, so as to effectively protect film layers below the transparent protective layer.

Generally, a bonding region is arranged at an edge of the display panel, a plurality of bonding pads are arranged in the bonding region, and the bonding pads may be bonded and connected with devices such as a flexible circuit board or an integrated chip, so that signal transmission between the display panel and the devices such as the flexible circuit board or the integrated chip is realized. The display panel further includes a plurality of signal leads through which the bonding pads can be coupled with the light emitting devices or touch electrodes. However, at the edge of the display panel, part of the signal leads are not covered by the encapsulation layer, and only the insulating film is provided on the part of the signal leads, and thus there is a risk of damaging the part of the signal leads during the process of patterning the mirror layer. In the embodiment of the present disclosure, the transparent protective layer may cover the signal leads and expose the bonding pads so as to protect the signal leads and prevent the signal leads from being damaged by over-etching in the process of patterning the mirror layer.

In some implementations, the transparent protective layer 30 may be made of silicon nitride (SiNx), silicon oxide (SiOx), or a composite material of SiNx/SiOx, or the transparent protective layer 30 may be made of other transparent materials, which is not limited herein. A thickness of the transparent protective layer 30 may be in a range from 0.2 μm to 0.4 μm, or the thickness of the transparent protective layer 30 may be in another range, which is not limited herein.

Since the mirror layer is usually made of a metal material with a relatively high reflectivity, static electricity is easily generated and accumulated in the mirror layer in the display panel during production, assembly, test or transportation of the display panel, which is likely to cause electrostatic discharge, and further, structures (such as the light emitting devices or driving circuits) inside the display panel are easily damaged, thereby affecting a normal use of the display panel. In view of above, the display panel provided in the embodiment of the present disclosure is provided with an electrostatic protective portion to release the static electricity in the mirror layer, and the following description is made in detail with reference to the accompanying drawings.

Figure 12:
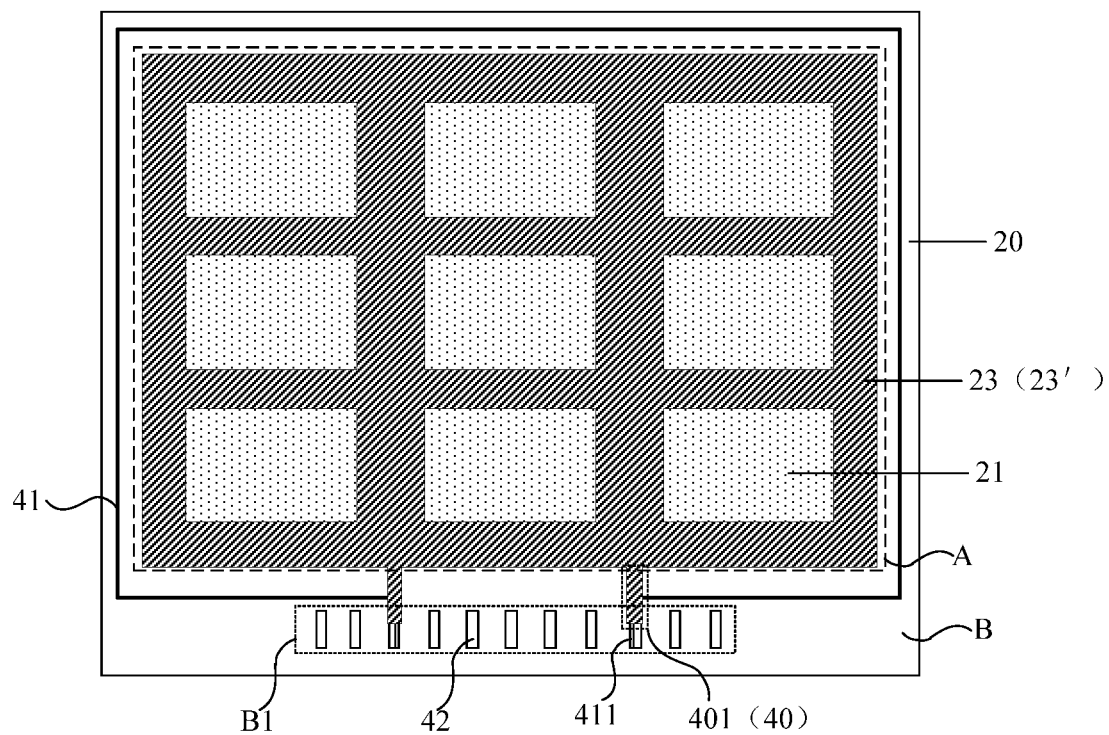
FIG. 12 is a schematic top view of a structure of a display panel according to an embodiment of the disclosure.

FIG. 12 is a schematic top view of a structure of a display panel provided in the embodiment of the present disclosure, and as shown in FIG. 12, the display panel provided in the embodiment of the present disclosure may further include at least one electrostatic protective portion 40 located on the base substrate 20 and coupled to the mirror layer 23; the electrostatic protective portion 40 is configured to release the static electricity in the mirror layer 23; the display panel has a display area A and a peripheral area B; the mirror layer 23 is located in the display area A, and the electrostatic protective portion 40 is located in the peripheral area B.

In the embodiment of the present disclosure, by providing the at least one electrostatic protective portion 40 coupled to the mirror layer 23 on the base substrate 20, the electrostatic protective portion 40 can release the static electricity in the mirror layer 23, so as to prevent the static electricity from accumulating in the mirror layer 23, and further prevent electrostatic discharge from occurring, thereby avoiding the damage to the structures inside the display panel due to electrostatic discharge. Moreover, the electrostatic protective portion 40 is provided in the peripheral area B, so that the electrostatic protective portion 40 does not occupy a space of the display area A of the display panel, and thus the display panel has a relatively large screen ratio. In addition, the mirror layer 23 is provided in the display area A, so that the mirror effect of the display panel is good, and certainly, the edge of the mirror layer 23 may slightly exceed the display area A, which is not limited herein.

In the embodiment of the present disclosure, the electrostatic protective portion may be implemented in various ways, and the following description is made in detail with reference to the accompanying drawings.

A first way of implementing the electrostatic protective portion is as follows.

In some implementations, as shown in FIG. 12, in the display panel provided by the embodiment of the present disclosure, the electrostatic protective portion 40 may include a conductive connection portion 401; the peripheral area B is provided with a constant voltage signal terminal 411 therein, and the conductive connection portion 401 is coupled to the constant voltage signal terminal 411.

In such way, the conductive connection portion 401 can transmit the static electricity generated in the mirror layer 23 to the constant voltage signal terminal 411 to conduct away the static electricity from the mirror layer 23.

Furthermore, referring to FIG. 12 again, the display panel may further include a constant voltage signal line 41 located on the base substrate 20, for example, the constant voltage signal line 41 may be a low-potential voltage signal line. The constant voltage signal line 41 may surround the display area A, or the constant voltage signal line 41 may be located at a side of the display area A, and the conductive connection portion 401 is coupled to the constant voltage signal line 41. In this way, the conductive connection portion 401 can transmit the static electricity generated in the mirror layer 23 to the constant voltage signal line 41 to conduct away the static electricity from the mirror layer 23.

In an implementation, the peripheral area B includes a bonding region B1, and a plurality of bonding pads 42 are provided in the bonding region B1, and the bonding pads 42 are configured to be bonded and connected with devices such as a flexible circuit board or an integrated chip. The conductive connection portion 401 described above may be provided in the bonding region B1.

In some implementations, in the display panel provided in the embodiment of the present disclosure, with continued reference to FIG. 12, the mirror layer 23 may include a metal material, and the conductive connection portion 401 and the mirror layer 23 are formed into one piece, that is, a pattern of the mirror layer 23 and a pattern of the conductive connection portion 401 are continuous with each other, and the mirror layer 23 and the conductive connection portion 401 are not to be connected or coupled in a lap joint manner or other manners, so that a better connection effect between the mirror layer 23 and the conductive connection portion 401 is achieved. In addition, in the process of manufacturing the display panel, the mirror layer 23 and the conductive connection portion 401 can be manufactured by adopting one patterning process, so that the manufacturing cost is reduced.

A second way of implementing the electrostatic protective portion is as follows.

Figure 13:
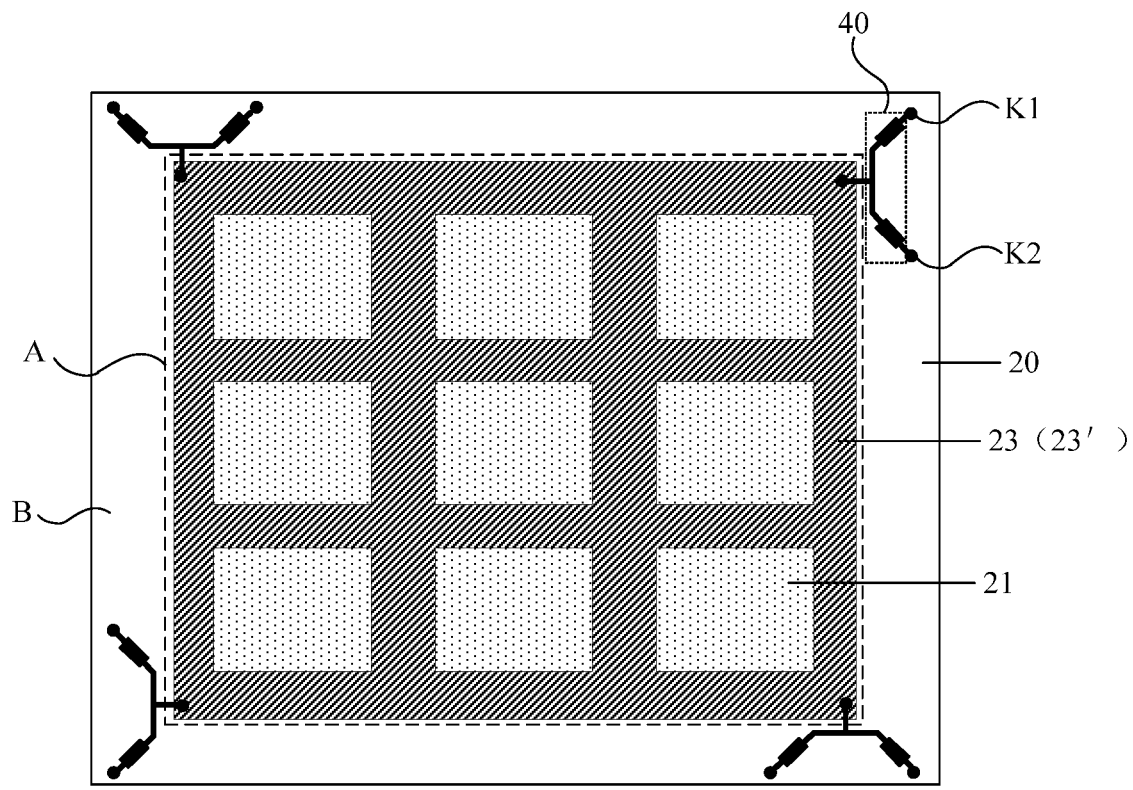
FIG. 13 is a schematic top view of a structure of a display panel according to an embodiment of the present disclosure.
Figure 14:
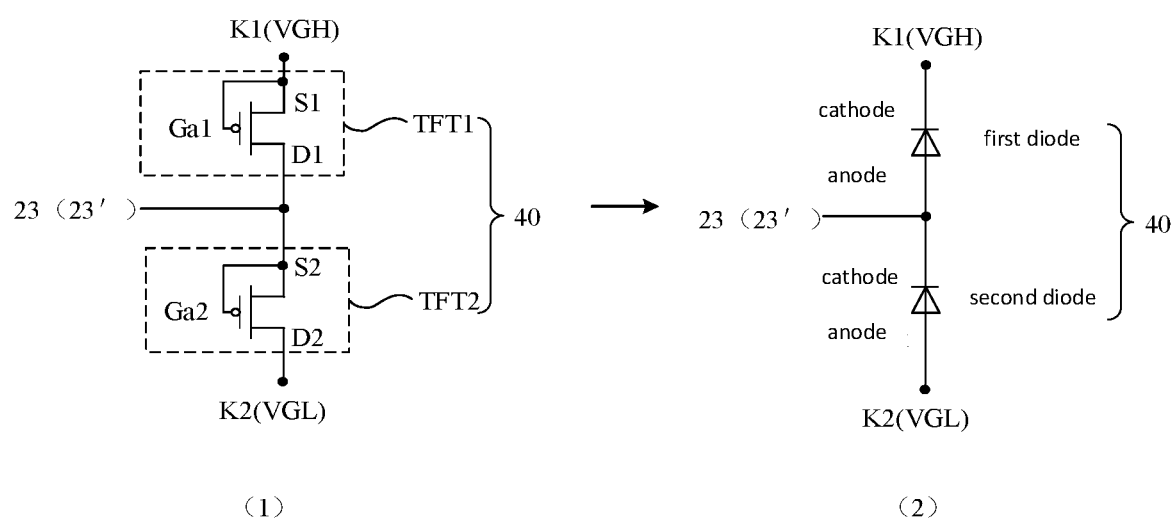
FIG. 14 is a schematic structural diagram of an electrostatic protective portion according to an embodiment of the present disclosure.

FIG. 13 is another schematic top view of a structure of the display panel provided in the embodiment of the present disclosure, and FIG. 14 is a schematic structural diagram of the electrostatic protective portion in the embodiment of the present disclosure, as shown in FIG. 13 and FIG. 14, in an implementation, the display panel provided in the embodiment of the present disclosure may further include a first voltage signal terminal K1 and a second voltage signal terminal K2, the first voltage signal terminal K1 and the second voltage signal terminal K2 may be provided in the peripheral area B. The first voltage signal terminal K1 is configured to transmit a first voltage signal, the second voltage signal terminal K2 is configured to transmit a second voltage signal, and a voltage of the first voltage signal is higher than that of the second voltage signal; or, the voltage of the first voltage signal is lower than that of the second voltage signal, in the embodiment of the present disclosure, a case where the voltage of the first voltage signal is higher than that of the second voltage signal is taken as an example for illustration, with VGH representing the first voltage signal, and VGL representing the second voltage signal.

As shown in (1) of FIG. 14, the electrostatic protection portion 40 may include a first transistor TFT1 and a second transistor TFT2, the first transistor TFT1 and the second transistor TFT2 may be P-type transistors or N-type transistors, and in the embodiment of the present disclosure, both the first transistor TFT1 and the second transistor TFT2 being P-type transistors is taken as an example for illustration.

A control terminal Ga1 of the first transistor TFT1 is coupled to a first terminal S1 of the first transistor TFT1, the first terminal S1 of the first transistor TFT1 is coupled to the first voltage signal terminal K1, and a second terminal D1 of the first transistor TFT1 is coupled to a first terminal S2 of the second transistor TFT2; a control terminal Ga2 of the second transistor TFT2 is coupled to the first terminal S2 of the second transistor TFT2, and a second terminal D2 of the second transistor TFT2 is coupled to the second voltage signal terminal K2; the mirror layer 23 is coupled to the second terminal D1 of the first transistor TFT1.

As shown in (2) of FIG. 14, the control terminal Ga1 of the first transistor TFT1 is coupled to the first terminal S1 of the first transistor TFT1, so that the first transistor TFT1 is equivalent to a diode, i.e., a first diode, the control terminal Ga1 and the first terminal S1 of the first transistor TFT1 are together equivalent to a cathode of the first diode, and the second terminal D1 of the first transistor TFT1 is equivalent to an anode of the first diode. The control terminal Ga2 of the second transistor TFT2 is coupled to the first terminal S2 of the second transistor TFT2, so that the second transistor TFT2 is equivalent to a diode, that is, a second diode, the control terminal Ga2 and the first terminal S2 of the second transistor TFT2 are together equivalent to a cathode of the second diode, and the second terminal D2 of the second transistor TFT2 is equivalent to an anode of the second diode.

In an implementation, the static electricity generated in the mirror layer 23 may be either positive static electricity or negative static electricity. In a case where the static electricity generated in the mirror layer 23 is positive static electricity and a voltage of the static electricity generated in the mirror layer 23 is higher than that of the first voltage signal VGH, the first transistor TFT1 is turned on, the second transistor TFT2 is turned off, and the first transistor TFT1 transmits the static electricity to the first voltage signal terminal K1. In a case where the static electricity generated in the mirror layer 23 is negative static electricity and the voltage of the static electricity generated in the mirror layer 23 is lower than that of the second voltage signal VGL, the first transistor TFT1 is turned off, the second transistor TFT2 is turned on, and the second transistor TFT2 transmits the static electricity to the second voltage signal terminal K2. In such way, the electrostatic protective portion 40 can release the static electricity regardless of whether the static electricity generated in the mirror layer 23 is positive static electricity or negative static electricity, thereby preventing the structures inside the display panel from being damaged by electrostatic discharge.

In practical applications, as shown in FIG. 13, the display panel provided in the embodiment of the present disclosure includes a plurality of electrostatic protective portions 40, and the electrostatic protective portions 40 are uniformly distributed around the mirror layer 23. For example, in FIG. 13, the display area A is rectangular, the display panel includes four electrostatic protective portions 40, and the electrostatic protective portions 40 are located at positions corresponding to four corners of the display area A. In addition, the electrostatic protective portions 40 in the display panel may be in other numbers, and the distribution of the electrostatic protective portions 40 may be set according to practical expections, which is not limited herein.

A third way of implementating the electrostatic protective portion is as follows.

Figure 15:
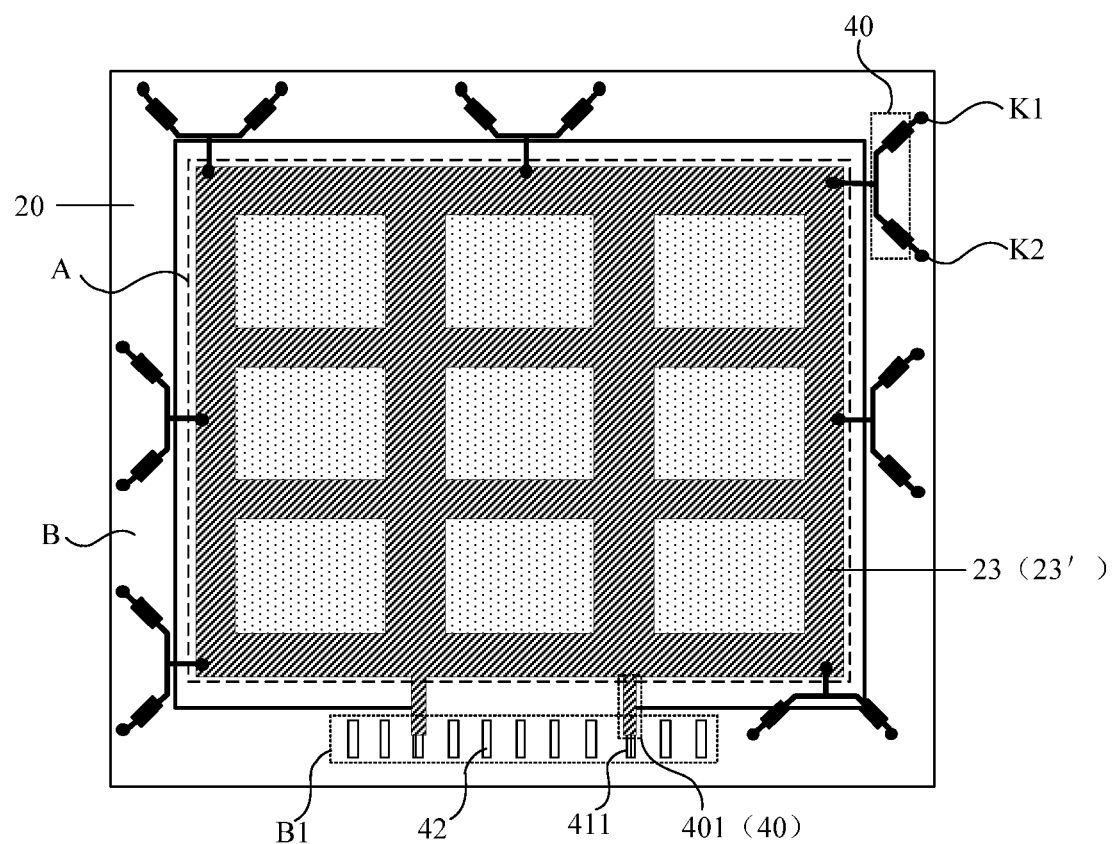
FIG. 15 is a schematic top view of a structure of a display panel according to an embodiment of the present disclosure.

FIG. 15 is another schematic top view of the structure of the display panel provided in the embodiment of the present disclosure, as shown in FIG. 15, in the embodiment of the present disclosure, the first way and the second way of implementing the electrostatic protective portion may be combined, that is, the conductive connection portion 401 coupled to the mirror layer 23 may be provided in the peripheral area B, and the electrostatic protective portions 40 coupled to the first voltage terminal K1 and the second voltage terminal K2 may also be provided in the peripheral area B, which may be set according to practical expections, and are not listed one by one herein.

Based on a same creative concept, an embodiment of the present disclosure further provides a display panel, and FIG. 2 is a schematic structural diagram of the display panel provided in the embodiment of the present disclosure, as shown in FIG. 2, the display panel provided in the embodiment of the present disclosure may include: a base substrate 20; a plurality of light emitting devices 21 located on the base substrate 20; an encapsulation layer 22 covering the light emitting devices 21; a reflective structure layer 23' located on a side of the encapsulation layer 22 away from the base substrate 20, with the reflective structure layer 23' including a plurality of first openings U1, an orthographic projection of each first opening U1 on the base substrate 20 overlapping an orthographic projection of at least one of the light emitting devices 21 on the base substrate 20; a transparent filling layer 24 located on a side of the encapsulation layer 22 away from the base substrate 20; at least part of the transparent filling layer 24 is located in the first openings U1 of the reflective structure layer 23'.

In the display panel provided by the embodiment of the present disclosure, the transparent filling layer is arranged on the side of the encapsulation layer away from the base substrate, and at least part of the transparent filling layer is arranged in the first openings of the reflective structure layer, so that the step between the first openings and the non-opening region in the reflective structure layer is reduced, and the surface of the display panel is relatively flat, therefore, when film layers such as the adhesive layer (such as the optical adhesive) and the cover plate are attached to the reflective structure layer in the subsequent processes, the defects such as wrinkles or bubbles are not easy to occur in superficial film layers (such as the adhesive layer) of the display panel, and the display yield of the display panel is improved.

The display panel provided in the embodiment of the present disclosure may be an organic light emitting diode display panel, referring to FIG. 2, the display panel in the embodiment of the present disclosure may include a plurality of light emitting devices 21, in order to clearly illustrate the structure of each film layer in the embodiment of the present disclosure, only one light emitting device 21 is shown in FIG. 2, and in an implementation, the number and distribution of the light emitting devices 21 may be set according to practical expections, which is not limited herein. Each light emitting device 21 may include a first electrode 211, a second electrode 212 located on a side of the first electrode 211 away from the base substrate 20, and an organic light emitting layer 213 located between the first electrode 211 and the second electrode 212; the first electrode 211 is an anode, and the second electrode 212 is a cathode; alternatively, the first electrode 211 is a cathode and the second electrode 212 is an anode. In an implementation, first electrodes 211 in the light emitting devices 21 may be separately provided, that is, each light emitting device 21 is provided with a separated and independent first electrode 211 therein, and the light emitting devices 21 may share one second electrode 212, that is, second electrodes 212 of the light emitting devices 21 may be formed into an entire electrode in a full surface.

With continued reference to FIG. 2, the display panel provided in the embodiment of the present disclosure may further include the encapsulation layer 22 located on the side of the light emitting devices 21 away from the base substrate 20, and the encapsulation layer 22 covers the plurality of light emitting devices 21 in the display panel to prevent the light emitting devices 21 from being corroded by moisture and oxygen.

In the embodiment of the present disclosure, as shown in FIG. 2, by providing the reflective structure layer 23' on the side of the encapsulation layer 22 away from the base substrate 20, the distance between the reflective structure layer 23' and the display surface of the display panel is relatively short, and a good mirror effect can be achieved. The reflective structure layer 23' includes a plurality of first openings U1, and an orthogonal projection of each first opening U1 on the base substrate 20 overlaps an orthogonal projection of at least one of the light emitting devices 21 on the base substrate 20, so that light emitted from each light emitting device 21 can be emitted through the first opening U1 so as to display an image. A region (i.e., a non-opening region) of the reflective structure layer 23' other than the first openings U1 can reflect light, and thus, the non-opening region of the reflective structure layer 23' can serve as a mirror. Therefore, the display panel can simultaneously realize the functions of display and mirror, and a user can watch an image reflected by the display panel and also can watch the image displayed by the display panel, thereby meeting various requirements of the user. The display panel provided by the embodiment of the disclosure may be applied to various scenes, for example, the display panel may be applied to scenes such as an advertisement screen in a public place, a vehicle-mounted rearview mirror and a display screen of a cash dispenser. In addition, external light cannot pass through the reflective structure layer 23' to reach interior of the display panel, so that the light emitted from each light emitting device 21 can not be affected by the external light, and the contrast of the display panel is improved.

In practical applications, with reference to FIG. 2, the reflective structure layer 23' may be made of a metal material with a relatively high reflectivity, for example, the reflective structure layer 23' may be made of aluminum or silver, and the reflective structure layer 23' may include at least two metal layers stacked together, for example, the reflective structure layer 23' may include metal layers of titanium/aluminum/titanium. In practices, a metal layer may be deposited on the encapsulation layer 22 by a low temperature sputtering process, and then patterned by using a patterning process to form the reflective structure layer 23' with the plurality of first openings U1. Certainly, the reflective structure layer 23' may be made of other materials with a relatively high reflectivity, which is not limited herein. In some implementations, a thickness of the reflective structure layer 23' may range from 200 nm to 500 nm, or from 200 nm to 350 nm, for example, the thickness of the reflective structure layer 23' may be about 310 nm.

FIG. 3 is a schematic structural diagram of the display panel being manufactured in the embodiment of the present disclosure, and with reference to FIG. 2 and FIG. 3, in the embodiment of the present disclosure, a transparent filling layer 24 is provided on a side of the encapsulation layer 22 away from the base substrate 20, and each first opening U1 in the reflective structure layer 23' is provided therein with at least a part of the transparent filling layer 24, so that the step between the first openings U1 and the non-opening region in the reflective structure layer 23' is reduced, and a surface of the display panel is relatively flat. When a film layer such as an adhesive layer 27 is subsequently attached to a surface of the reflective structure layer 23', defects such as wrinkles and bubbles are less likely to occur in the film layer such as the adhesive layer 27. As shown in FIG. 3, the adhesive layer 27 may be spread by a roller 13, and as is apparent from FIG. 3, the surface of the adhesive layer 27 is relatively flat and does not have defects such as wrinkles or bubbles therein.

In addition, as shown in FIG. 2, since the transparent filling layer 24 is transparent, the light emitted from the light emitting device 21 can pass through the transparent filling layer 24, and thus, the display effect of the display panel is not affected by the transparent filling layer 24.

In the embodiment of the present disclosure, the transparent filling layer may be implemented by at least two ways, which are described in detail below with reference to the accompanying drawings.

A first way for implementing the transparent filling layer is as follows.

As shown in FIG. 2, in the display panel provided in the embodiment of the present disclosure, the transparent filling layer 24 may include a first transparent filling layer 241 and a second transparent filling layer 242, where the second transparent filling layer 242 is located on a side of the reflective structure layer 23' away from the base substrate 20; the first transparent filling layer 241 may include a plurality of filling portions 241' separately provided, only one filling portion 241' is illustrated in the figure for clearly illustrating the structure of the transparent filling layer 24, and in practical applications, the filling portions 241' may be provided at positions of the plurality of first openings U1; a part of the filling portions 241' are located in the first openings U1, and a surface of each filling portion 241' away from the base substrate 20 is substantially flush with a surface of the second transparent filling layer 242 away from the base substrate 20, which means that a distance between the surface of each filling portion 241' away from the base substrate 20 and the surface of the second transparent filling layer 242 away from the substrate 20 may be within a certain deviation range, for example, the distance may be less than 30 nm, that is, the surface of the transparent filling layer 24 away from the substrate 20 is substantially flat and may fluctuate in a range less than 30 nm.

In the embodiment of the present disclosure, the first transparent filling layer 241 includes a plurality of filling portions 241', and the filling portions 241' may fill the first openings U1, in some implementations, the plurality of filling portions 241' in the first transparent filling layer 241 may correspond the plurality of first openings U1 in the reflective structure layer 23' one to one, so that the first openings U1 in the reflective structure layer 23' are filled by the transparent filling layer 24, and a thickness of each filling portion 241' in a direction perpendicular to the base substrate 20 may be the same as a total thickness of the reflective structure layer 23' and the second transparent filling layer 242 in the direction perpendicular to the base substrate 20, thereby, a better filling effect is achieved by the filling portions 241', and the surface of the transparent filling layer 24 away from the base substrate 20 may be a flat surface, in this way, the transparent filling layer 24 can play a role of flattening, so that the surface of the display panel is more flat. In addition, the transparent filling layer 24 can also protect the reflective structure layer 23', that is, prevent the surface of the reflective structure layer 23' from being damaged by the subsequent process.

In an implementation, with reference to FIG. 2, in the display panel provided in the embodiment of the present disclosure, the transparent filling layer 24 may include an organic material, for example, may include a resin material. In some implementations, the first transparent filling layer 241 and the second transparent filling layer 242 in the transparent filling layer 24 may be formed into one piece, so that the transparent filling layer 24 is easier to be manufactured. In the process of manufacturing the transparent filling layer 24, an organic material is coated on the reflective structure layer 23', and the organic material can achieve a better leveling effect and can fill each first opening U1 in the reflective structure layer 23', and cover the non-opening region of the reflective structure layer 23', so as to form the transparent filling layer 24. Moreover, the organic material can achieve a good flattening effect, so that the surface of the transparent filling layer 24 away from the base substrate 20 is a flat surface.

In some implementations, a thickness of the first transparent filling layer 241 may be in a range from 200 nm to 1000 nm, or in a range from 300 nm to 600 nm, for example, the thickness of the first transparent filling layer 241 may be about 560 nm, a thickness of the second transparent filling layer 242 may be in a range from 200 nm to 400 nm, and for example, the thickness of the second transparent filling layer 242 may be about 310 nm.

The second way of implementating the transparent filling layer is as follows.

FIG. 4 is another schematic structural diagram of the display panel provided in the embodiment of the present disclosure, and as shown in FIG. 4, in the display panel provided in the embodiment of the present disclosure, the transparent filling layer 24 may include a plurality of filling portions 241' separately provided; the filling portions 241' are located in the first openings U1, respectively, and a surface of each filling portion 241' away from the base substrate 20 is substantially flush with a surface of the reflective structure layer 23' away from the base substrate 20, which means that a distance between the surface of each filling portion 241' away from the base substrate 20 and the surface of the reflective structure layer 23' away from the base substrate 20 may be within a certain deviation range, for example, the distance may be less than 30 nm.

In the embodiment of the present disclosure, the transparent filling layer 24 may include a plurality of filling portions 241' separately provided, and the filling portions 241' may fill the first openings U1, respectively. In some implementations, the plurality of filling portions 241' in the transparent filling layer 24 may correspond to the plurality of first openings U1 in the reflective structure layer 23' one to one, so that the transparent filling layer 24 fills each first opening U1 in the reflective structure layer 23'. Moreover, the surface of each filling portion 241' away from the base substrate 20 is substantially flush with the surface of the reflective structure layer 23' away from the base substrate 20, so that the surface of the reflective structure layer 23' away from the base substrate 20 is relatively flat. In an implementation, the thickness of each filling portion 241' may be set according to the thickness of the reflective structure layer 23', so that the filling portions 241' can fill and level up the first openings U1.

In an implementation, in the display panel provided in the embodiment of the present disclosure, with continued reference to FIG. 4, the filling portions 241' may include an inorganic material, for example, a silicon dioxide material or a silicon nitride material. In the process of manufacturing the filling portions 241', an inorganic layer having a thickness the same as that of the reflective structure layer 23' is deposited on the reflective structure layer 23' by using a chemical vapor deposition process, and then the inorganic layer is patterned by using a patterning process to remove the inorganic layer in the non-opening region, so as to form the plurality of filling portions 241' in the first openings U1.

In a practical application, in the display panel provided by the embodiment of the disclosure, a transmittance of the transparent filling layer is greater than 90%, and the transparent filling layer is made of a material with a relatively high transmittance, so that light emitted from the light emitting device can pass through the transparent filling layer, and the display effect of the display panel cannot be influenced by the transparent filling layer. Certainly, the transmittance of the transparent filling layer may also be less than 90%, and may be set according to practical expections, which is not limited herein.

FIG. 5 is a partially enlarged view of a structure of FIG. 2, and for clarity of illustrating the structure of the encapsulation layer, FIG. 5 only illustrates the encapsulation layer, the reflective structure layer and the transparent filling layer, and other film layers are omitted. As shown in FIGS. 2 and 5, the encapsulation layer 22 may include inorganic film layers 221 and an organic film layer 222 which are stacked, the inorganic film layers 221 can block moisture and oxygen, and the organic film layer 222 may be located between any two adjacent inorganic film layers 221, can play roles of releasing stress and flattening. For the inorganic film layer 221 closest to the reflective structure layer 23', a thickness h1 of the inorganic film layer 221 at positions of the first openings U1 is less than a thickness h2 of the inorganic film layer 221 at a position of a pattern of the reflective structure layer 23', i.e., the thickness h1 of the inorganic film layer 221 at the positions of the light emitting devices 21 is relatively small, so that the inorganic film layer 221 has less influence on the light emitted from the light emitting devices 21, and the light transmittance of the display panel can be improved. In a practical process, process parameters for forming the reflective structure layer 23' may be adjusted, and during etching the reflective structure layer 23', an overetching may occur at the positions of the first openings U1, so that the thickness h1 of the inorganic film layer 221 at the positions of the light emitting devices 21 is relatively small. In some implementations, a total thickness of the encapsulation layer 22 may be in a range from 500 nm to 800 nm, where a thickness of the encapsulation layer 22 at the positions of the first openings U1 may be about 540 nm, and a thickness of the encapsulation layer 22 at the position of the pattern of the reflective structure layer 23' may be about 610 nm.

In order to clearly illustrate the structure of the inorganic film layer 221 closest to the reflective structure layer 23', in FIG. 5, the thickness of the inorganic film layer 221 is illustrated as being relatively large, and in an implementation, the thickness of each inorganic film layer 221 in the encapsulation layer 22 may be set according to practical expections, which is not limited herein. In addition, in FIG. 5, the transparent filling layer 24 has the structure implemented by the first way, and in a case where the transparent filling layer 24 has the structure implemented by the second way, the inorganic film layer 221 closest to the reflective structure layer 23' may be provided so that the thickness h1 of the inorganic film layer 221 at the positions of the first openings U1 is less than the thickness h2 of the inorganic film layer 221 at the position of the pattern of the reflective structure layer 23'.

In an implementation, as shown in FIGS. 2 and 4, in the display panel provided by the embodiment of the disclosure, in a direction from the base substrate 20 to the reflective structure layer 23', a cross-sectional area of each first opening U1 in a direction parallel to the base substrate 20 is gradually increased, that is, a side wall of each first opening U1 is formed with an inclined surface, so that light emitted from each light emitting device 21 is reflected by the side wall of the first opening U1 and then emitted, and light extraction efficiency of the display panel is improved.

As shown in FIG. 2, the display panel provided in the embodiment of the present disclosure may further include a pixel defining layer 25 located between the base substrate 20 and the encapsulation layer 22; the pixel defining layer 25 may include a plurality of second openings U2 corresponding to the light emitting devices 21 one to one; and the plurality of first openings U1 in the reflective structure layer 23' correspond to the second openings U2 one to one.

In the embodiment of the present disclosure, the display panel may include a plurality of sub-pixels, and the pixel defining layer is configured to define an area of each sub-pixel, that is, a position of each second opening U2 corresponds to one sub-pixel. By providing the plurality of first openings U1 in the reflective structure layer 23' to correspond to the second openings U2 one to one, on one hand, it can be ensured that light emitted from each light emitting device 21 can pass through the first opening U1 corresponding to the light emitting device, and thus it is ensured that the display panel has a good display effect, and on the other hand, an area of the non-opening region of the reflective structure layer 23' may be made larger, and the mirror effect of the display panel is made better.

FIG. 6 is a schematic diagram illustrating a corresponding relationship between the first openings and the second openings in the embodiment of the present disclosure, as shown in (1) and (2) of FIG. 6, in the display panel provided in the embodiment of the present disclosure, an orthographic projection of each second opening U2 on the base substrate is located within the orthographic projection of the first opening U1 corresponding to the second opening on the base substrate, that is, a size of each first opening U1 in the reflective structure layer is larger than a size of the second opening U2 corresponding to the first opening, or the size of each first opening U1 in the reflective structure layer is equivalent to the size of the second opening U2 corresponding to the first opening, so that light emitted by each light emitting device can not be blocked by the reflective structure layer, and thus, the reflective structure layer does not affect an aperture ratio of the display panel, and a display effect of the display panel is good.

In addition, as shown in (3) in FIG. 6, the orthographic projection of each first opening U1 on the base substrate may also be set to be within the orthographic projection of the second opening U2 corresponding to the first opening on the base substrate, that is, the size of each first opening U1 in the reflective structure layer is less than the size of the second opening U2 corresponding to the first opening, so that although an edge of each first opening U1 in the reflective structure layer may block part of the light emitted from the light emitting device, the reflectivity of the display panel may be improved, that is, the mirror effect of the display panel may be improved.

In an implementation, a shape of each first opening U1 may be the same as that of the second opening U2, for example, in FIG. 6, both shapes of each first opening U1 and each second opening U2 are hexagonal, and in an implementation, each first opening U1 and each second opening U2 may also be other shapes, which is not limited herein.

FIG. 7 is a schematic diagram illustrating a corresponding relationship between an aperture ratio of the reflective structure layer and the mirror reflectivity of the display panel, as shown in FIG. 7, a curve L1 illustrates the corresponding relationship between the aperture ratio of the reflective structure layer and the mirror reflectivity of the display panel with the reflective structure layer, and a curve L2 illustrates the mirror reflectivity of the display panel without the reflective structure layer. It should be understood that the aperture ratio of the reflective structure layer refers to a ratio of a total area of the first openings in the reflective structure layer to a total area of the sub-pixels corresponding to the first openings. As can be seen from FIG. 7, for the display panel provided with the reflective structure layer, as the aperture ratio of the reflective structure layer increases, a total area of the first openings in the reflective structure layer increases, and a total area of the non-opening region of the reflective structure layer decreases, so that the mirror reflectivity of the display panel gradually decreases. For the display panel without the reflective structure layer, the mirror reflectivity of the display panel is relatively low.

In practical applications, a test light source and a luminance meter may be used for detecting the mirror reflectivity of the display panel, specifically, the test light source and the luminance meter may be arranged at a preset position on a side of the display surface of the display panel, so that light emitted from the test light source can be emitted to the display surface of the display panel and reflected to the luminance meter by the display surface of the display panel, and the mirror reflectivity of the display panel can be determined according to the luminance of light emitted from the test light source and the luminance detected by the luminance meter. In an implementation, the mirror reflectivity of the display panel may be set to be larger than 50%, for example, the mirror reflectivity may be set to be in a range from 85% to 97%, the transmittance of the display panel is set to be in a range from 46% to 81%, and the size of the first opening in the reflective structure layer may be set according to a practical scene, namely according to the size of the mirror reflectivity desired by the display panel.

An aperture ratio of the pixel defining layer may be in a range from 15% to 30%, or in a range from 20% to 26%, for example, the aperture ratio of the pixel defining layer may be set to about 21%, and the aperture ratio of the pixel defining layer may be understood as a ratio of a total area of the second openings in the pixel defining layer to a total area of the sub-pixels corresponding to the second openings. A width of each second opening in the pixel defining layer may be set in a range from 8 μm to 25 μm, or in a range from 10 μm to 20 μm, for example, the width of each second opening may be set to about 15 μm, and a width of each first opening in the reflective structure layer may be set in a range from 7 μm to 23 μm. In an implementation, the ratio of the area of each first opening to the area of each second opening may be set in a range from 0.38 to 1.89.

In a practical application, as shown in FIG. 2, in order to drive each light emitting device 21 to emit light, the display panel may further include a thin film transistor TFT, a capacitor structure (not shown) and the like, where the thin film transistor TFT may include an active layer Ac, a source S, a drain D, and a gate Ga, and the drain D of the thin film transistor TFT is coupled to the first electrode 211. In order to insulate conductive members of different film layers from each other, the display panel may further include a first gate insulating layer GI1 between the active layer Ac and the gate Ga, a second gate insulating layer GI2 and an interlayer insulating layer ILD between the gate Ga and the source S, a planarization layer PLN between the source S and the first electrode 211, and a buffer layer 29 between the active layer Ac and the base substrate 20. In addition, the display panel may further include a passivation layer (not shown) between the source S and the planarization layer PLN to protect the source S and the drain D from being oxidized.

FIG. 8 is another schematic structural diagram of the display panel provided in the embodiment of the present disclosure, and as shown in FIG. 8, the display panel provided in the embodiment of the present disclosure may further include a touch electrode layer 26' formed on a side, away from the base substrate 20, of the transparent filling layer 24. In such way, the display panel can realize a touch function, and the touch electrode layer 26' is close to the display surface of the display panel, thus the touch effect of the display panel is better. In a practical process, the touch electrode layer 26' may be formed directly on the transparent filling layer 24, and a patterning process may be performed on the touch electrode layer 26' to form a plurality of touch electrodes. In addition, the display panel may further include a cover plate 28, and an adhesive layer 27 between the cover plate 28 and the touch electrode layer 26'. The cover plate 28 may protect structures inside the display panel, and the adhesive layer 27 can adhere the cover plate 28 to the surface of the touch electrode layer 26'.

FIG. 9 is a schematic top view of a structure of the display panel provided in the embodiment of the present disclosure, and as shown in FIG. 9, in the display panel provided in the embodiment of the present disclosure, the touch electrode layer may include a plurality of touch electrodes 261 made of metal meshes; an orthographic projection of each touch electrode 261 on the base substrate is within an orthographic projection of a pattern of the pixel defining layer 25 on the base substrate, that is, the orthographic projection of each metal mesh in the touch electrode 261 on the base substrate does not overlap the orthographic projection of each second opening U2 in the pixel defining layer 25 on the base substrate.

With such arrangement, the touch electrodes can not block the light emitted from each light emitting device, and the display effect of the display panel can not be influenced.

As shown in FIG. 2, in some implementations, the display panel may further include a touch module 26 located on a side of the transparent filling layer 24 away from the base substrate 20, and an adhesive layer 27 located between the touch module 26 and the transparent filling layer 24, for example, the adhesive layer 27 may be an optical adhesive. In a practical process, the adhesive layer 27 may be attached to the surface of the transparent filling layer 24, then the touch module 26 is attached to the surface of the adhesive layer 27, so that the touch module 26 is attached to the surface of the transparent filling layer 24 through the adhesive layer 27. In the embodiment of the disclosure, since at least a part of the transparent filling layer 24 is provided in the first openings U1 in the reflective structure layer 23', defects such as wrinkles or bubbles can be prevented from occurring in the adhesive layer 27 formed on the transparent filling layer 24, and the yield of the display panel is relatively high.

In some implementations, the touch module 26 may include a plurality of touch electrodes, and the touch electrodes may be made of a transparent conductive material, for example, an Indium Tin Oxide (ITO) material, so that the touch module can not block light emitted from the light emitting devices, and can not affect the display effect of the display panel.

In addition, with continued reference to FIG. 2, the display panel provided in the embodiment of the present disclosure may further include the cover plate 28, and the adhesive layer 27 located between the cover plate 28 and the touch module 26. The cover plate 28 can protect structures inside the display panel, and the adhesive layer 27 can adhere the cover plate 28 to the surface of the touch module 26.

FIG. 10 is a schematic diagram of an arrangement of pixels of the display panel provided in the embodiment of the present disclosure, and as shown in FIG. 10, the display panel provided in the embodiment of the present disclosure may include a plurality of repeating units W arranged in an array in a first direction F1 and a second direction F2; the first direction F1 and the second direction F2 intersect with each other, for example, the first direction F1 and the second direction F2 may be perpendicular to each other; each repeating unit W may include four sub-pixels, i.e., one first sub-pixel P1, one second sub-pixel P2, and two third sub-pixels P3, each sub-pixel is provided with a light emitting device therein; in each repeating unit W, the first sub-pixel P1 and the second sub-pixel P2 each extend in the first direction F1 and are arranged in the second direction F2, and the third sub-pixels P3 are located between the first sub-pixel P1 and the second sub-pixel P2. In some implementations, the first sub-pixel P1 may be a blue sub-pixel, the second sub-pixel P2 may be a red sub-pixel, and the third sub-pixels P3 each may be a green sub-pixel, and in an implementation, the color of each sub-pixel may be adjusted according to a practical expection, which is not limited herein. In a practical application, the sub-pixels in a same repeating unit W may correspond to one display pixel, or the sub-pixels in different repeating units W may correspond to one display pixel, which may be set according to practical display expections, and is not limited herein.

In some implementations, in each repeating unit W, the first sub-pixel P1 and the second sub-pixel P2 each may be hexagonal, the third sub-pixels P3 each may be pentagonal, or the first sub-pixel P1, the second sub-pixel P2 and the third sub-pixels P3 may be of other shapes, which is not limited herein. In the embodiment of the present disclosure, a shape of each second opening in the pixel defining layer may be the same as the shape of the sub-pixel corresponding to second opening, and in an implementation, the shape of each second opening may be set according to the shape of the sub-pixel corresponding to the second opening.

In practical applications, in the display panel provided by the embodiment of the disclosure, the plurality of first openings in the reflective structure layer correspond to the repeating units one to one. In such way, the reflective structure layer can not block the light emitted from each sub-pixel in the repeating unit, and the display effect of the display panel is better.

FIG. 11 is another schematic structural diagram of the display panel provided in the embodiment of the present disclosure, and as shown in FIG. 11, the display panel provided in the embodiment of the present disclosure may further include a transparent protective layer 30 between the reflective structure layer 23' and the encapsulation layer 22. In the process of manufacturing the display panel, the transparent protective layer 30 can protect a film layer therebelow from being damaged in the process of patterning the reflective structure layer 23', and the light emitted from the light emitting device 21 can pass through the transparent protective layer 30, so that the display effect of the display panel cannot be influenced. In an implementation, at an edge of the display panel, an edge of the transparent protective layer may exceed edges of the encapsulation layer and the reflective structure layer, so as to effectively protect the film layers below the transparent protective layer.

Generally, a bonding region is arranged at an edge of the display panel, a plurality of bonding pads are arranged in the bonding region, and the bonding pads may be bonded and connected with devices such as a flexible circuit board or an integrated chip, so that signal transmission between the display panel and the devices such as the flexible circuit board or the integrated chip is realized. The display panel further includes a plurality of signal leads, through which the bonding pads can be coupled with the light emitting devices or touch electrodes. However, at the edge of the display panel, part of the signal leads are not covered by the encapsulation layer, and only the insulating film is provided on the part of the signal leads, so that there is a risk of damaging the part of the signal leads during the process of patterning the reflective structure layer. In the embodiment of the present disclosure, the transparent protective layer may cover the signal leads and expose the bonding pads so as to protect the signal leads and prevent the signal leads from being damaged by over-etching in the process of patterning the reflective structure layer.

In some implementations, the transparent protective layer 30 may be made of silicon nitride (SiNx), silicon oxide (SiOx), or a composite material of SiNx/SiOx, or the transparent protective layer 30 may also be made of other transparent materials, which is not limited herein. A thickness of the transparent protective layer 30 may be in a range from 0.2 μm to 0.4 μm, or the thickness of the transparent protective layer 30 may be in another range, which is not limited herein.

Since the reflective structure layer is usually made of a metal material with a relatively high reflectivity, static electricity is easily generated and accumulated in the reflective structure layer in the display panel during production, assembly, test or transportation of the display panel, which is likely to cause electrostatic discharge, and further, the structures (such as the light emitting devices or driving circuits) inside the display panel are easily damaged, thereby affecting the normal use of the display panel. In view of above, the display panel provided in the embodiment of the present disclosure is provided with an electrostatic protective portion to release the static electricity from the reflective structure layer, and the following description is made in detail with reference to the accompanying drawings.

FIG. 12 is a schematic top view of a structure of the display panel provided in the embodiment of the present disclosure, and as shown in FIG. 12, the display panel provided in the embodiment of the present disclosure may further include at least one electrostatic protective portion 40 located on the base substrate 20 and coupled with the reflective structure layer 23'; the electrostatic protective portion 40 is configured to release the static electricity from the reflective structure layer 23'; the display panel has a display area A and a peripheral area B; the reflective structure layer 23' is located in the display area A, and the electrostatic protective portion 40 is located in the peripheral area B.

In the embodiment of the present disclosure, by providing the at least one electrostatic protective portion 40 coupled to the reflective structure layer 23' on the base substrate 20, the electrostatic protective portion 40 can release the static electricity in the reflective structure layer 23', so as to prevent the static electricity from accumulating in the reflective structure layer 23', and further prevent electrostatic discharge phenomenon from occurring, thereby avoiding the damage to the structures inside the display panel due to electrostatic discharge. Moreover, the electrostatic protective portion 40 is provided in the peripheral area B, so that the electrostatic protective portion 40 does not occupy a space of the display area A of the display panel, and thus the display panel has a large screen ratio. In addition, the reflective structure layer 23' is provided in the display area A, so that the mirror effect of the display panel is good, and certainly, the edge of the reflective structure layer 23' may slightly exceed the display area A, which is not limited herein.

In the embodiment of the present disclosure, the electrostatic protective portion may be implemented in various ways, and the following description is made in detail with reference to the accompanying drawings.

A first way of implementing the electrostatic protective portion is as follows.

In some implementations, as shown in FIG. 12, in the display panel provided by the embodiments of the present disclosure, the electrostatic protective portion 40 may include a conductive connection portion 401; the peripheral area B is provided with a constant voltage signal terminal 411 therein, and the conductive connection portion 401 is coupled to the constant voltage signal terminal 411.

In such way, the conductive connection portion 401 can transmit the static electricity generated in reflective structure layer 23' to the constant voltage signal terminal 411 to conduct away the static electricity from the reflective structure layer 23'.

Furthermore, referring to FIG. 12 again, the display panel may further include a constant voltage signal line 41 located on the base substrate 20, for example, the constant voltage signal line 41 may be a low-potential voltage signal line. The constant voltage signal line 41 may surround the display area A, or the constant voltage signal line 41 may be located at a side of the display area A, and the conductive connection portion 401 is coupled to the constant voltage signal line 41. In this way, the conductive connection portion 401 can transmit the static electricity generated in the reflective structure layer 23' to the constant voltage signal line 41 to conduct away the static electricity from the reflective structure layer 23'.

In an implementation, the peripheral area B includes a bonding region B1, and a plurality of bonding pads 42 are provided in the bonding region B1, and the bonding pads 42 are configured to be bonded and connected with devices such as a flexible circuit board or an integrated chip. The conductive connection portion 401 described above may be provided in the bonding region B1.

In some implementations, in the display panel provided in the embodiment of the present disclosure, with continued reference to FIG. 12, the reflective structure layer 23' may include a metal material, and the conductive connection portion 401 and the reflective structure layer 23' are formed into one piece, that is, a pattern of the reflective structure layer 23' and a pattern of the conductive connection portion 401 are continuous with each other, and the reflective structure layer 23' and the conductive connection portion 401 are not to be connected in a lap joint manner or other manners, so that a better connection effect between the reflective structure layer 23' and the conductive connection portion 401 is achieved. In addition, in the process of manufacturing the display panel, the reflective structure layer 23' and the conductive connection portion 401 can be manufactured by adopting one patterning process, so that the manufacturing cost is reduced.

A second way of implementating the electrostatic protective portion is as follows.

FIG. 13 is another schematic top view of the structure of the display panel provided in the embodiment of the present disclosure, and FIG. 14 is a schematic structural diagram of the electrostatic protective portion in the embodiment of the present disclosure, as shown in FIG. 13 and FIG. 14, in an implementation, the display panel provided in the embodiment of the present disclosure may further include a first voltage signal terminal K1 and a second voltage signal terminal K2, the first voltage signal terminal K1 and the second voltage signal terminal K2 may be provided in the peripheral area B. The first voltage signal terminal K1 is configured to transmit a first voltage signal, the second voltage signal terminal K2 is configured to transmit a second voltage signal, and a voltage of the first voltage signal is higher than that of the second voltage signal; or, the voltage of the first voltage signal is lower than that of the second voltage signal, in the embodiment of the present disclosure, a case where the voltage of the first voltage signal is higher than that of the second voltage signal is taken as an example for illustration, with VGH representing the first voltage signal, and VGL representing the second voltage signal.

As shown in (1) of FIG. 14, the electrostatic protection portion 40 may include a first transistor TFT1 and a second transistor TFT2, the first transistor TFT1 and the second transistor TFT2 may be P-type transistors or N-type transistors, and in the embodiment of the present disclosure, both the first transistor TFT1 and the second transistor TFT2 being P-type transistors is taken as an example for illustration.

A control terminal Ga1 of the first transistor TFT1 is coupled to a first terminal S1 of the first transistor TFT1, the first terminal S1 of the first transistor TFT1 is coupled to the first voltage signal terminal K1, and a second terminal D1 of the first transistor TFT1 is coupled to a first terminal S2 of the second transistor TFT2; a control terminal Ga2 of the second transistor TFT2 is coupled to the first terminal S2 of the second transistor TFT2, and a second terminal D2 of the second transistor TFT2 is coupled to the second voltage signal terminal K2; the reflective structure layer 23' is coupled to the second terminal D1 of the first transistor TFT1.

As shown in (2) of FIG. 14, the control terminal Ga1 of the first transistor TFT1 is coupled to the first terminal S1 of the first transistor TFT1, so that the first transistor TFT1 is equivalent to a diode, i.e., a first diode, the control terminal Ga1 and the first terminal S1 of the first transistor TFT1 are together equivalent to a cathode of the first diode, and the second terminal D1 of the first transistor TFT1 is equivalent to an anode of the first diode. The control terminal Ga2 of the second transistor TFT2 is coupled to the first terminal S2 of the second transistor TFT2, so that the second transistor TFT2 is equivalent to a diode, that is, a second diode, the control terminal Ga2 and the first terminal S2 of the second transistor TFT2 are together equivalent to a cathode of the second diode, and the second terminal D2 of the second transistor TFT2 is equivalent to an anode of the second diode.

In an implementation, the static electricity generated in the reflective structure layer 23' may be either positive static electricity or negative static electricity. In a case where the static electricity generated in the reflective structure layer 23' is positive static electricity and a voltage of the static electricity generated in the reflective structure layer 23' is higher than that of the first voltage signal VGH, the first transistor TFT1 is turned on, the second transistor TFT2 is turned off, and the first transistor TFT1 transmits the static electricity to the first voltage signal terminal K1. In a case where the static electricity generated in the reflective structure layer 23' is negative static electricity and the voltage of the static electricity generated in the reflective structure layer 23' is lower than that of the second voltage signal VGL, the first transistor TFT1 is turned off, the second transistor TFT2 is turned on, and the second transistor TFT2 transmits the static electricity to the second voltage signal terminal K2. In such way, the electrostatic protective portion 40 can release the static electricity regardless of whether the static electricity generated in the reflective structure layer 23' is positive static electricity or negative static electricity, thereby preventing the structures inside the display panel from being damaged by electrostatic discharge.

In practical applications, as shown in FIG. 13, the display panel provided in the embodiment of the present disclosure includes a plurality of electrostatic protective portions 40, and the electrostatic protective portions 40 are uniformly distributed around the reflective structure layer 23'. For example, in FIG. 13, the display area A is rectangular, the display panel includes four electrostatic protective portions 40, and the electrostatic protective portions 40 are located at positions corresponding to four corners of the display area A. In addition, the electrostatic protective portions 40 in the display panel may be in other numbers, and the distribution of the electrostatic protective portions 40 may be set according to practical expections, which is not limited herein.

A third way of implementating the electrostatic protective portion is as follows.

FIG. 15 is another schematic top view of the structure of the display panel provided in the embodiment of the present disclosure, as shown in FIG. 15, in the embodiment of the present disclosure, the first way and the second way of implementing the electrostatic protective portion may be combined, that is, the conductive connection portion 401 coupled to the reflective structure layer 23' may be provided in the peripheral area B, and the electrostatic protective portions 40 coupled to the first voltage terminal K1 and the second voltage terminal K2 may be provided in the peripheral area B, which can be set according to practical expections, and are not listed one by one herein.

Based on the same creative concept, an embodiment of the present disclosure further provides a display device, which includes the display panel described above, and the display device may be applied to any product or component having a display function, such as a mobile phone, a tablet computer, a television, a display, a notebook computer, a digital photo frame, a navigator, and the like. Since the principle of the display device for solving problems is similar to that of the display panel, the implementations of the display device may refer to the implementations of the display panel, and repeated descriptions are omitted.

According to the display panel and the display device provided by the embodiments of the present disclosure, by providing the transparent filling layer on a side of the encapsulation layer away from the base substrate to fill and level up the first openings in the mirror layer, so that the step between the first openings and the non-opening region in the mirror layer is eliminated, and the surface of the display panel is relatively flat, therefore, during other films such as the adhesive layer (such as the optical adhesive) and the cover plate being attached on the mirror layer in the seusequent process, defects such as wrinkles or bubbles are not easy to occur in superficial film layers (such as the adhesive layer) of the display panel, and the display yield of the display panel is improved.

Although embodiments of the present disclosure have been described, those skilled in the art may make additional changes and modifications to the embodiments based on the basic inventive concept they know. Therefore, the appended claims are intended to be interpreted as including the described embodiments and all changes and modifications falling within the scope of the present disclosure It will be apparent to those skilled in the art that various modifications and variations may be made to the embodiments of the present disclosure without departing from the spirit and scope of the embodiments of the present disclosure. If such modifications and variations to the embodiments of the present disclosure are within the scope of the claims of the present disclosure and their equivalents, the present disclosure is intended to encompass such modifications and variations.

What is claimed is:

1. A display panel, comprising:
   a base substrate;
   a plurality of light emitting devices located on the base substrate;
   an encapsulation layer covering the light emitting devices;
   a mirror layer located on a side of the encapsulation layer away from the base substrate, where the mirror layer comprises a plurality of first openings, and an orthographic projection of each first opening on the base substrate overlaps an orthographic projection of at least one of the light emitting devices on the base substrate; and
   a transparent filling layer located on a side of the encapsulation layer away from the base substrate,
   wherein at least part of the transparent filling layer is located in each of the first openings, wherein
   the encapsulation layer comprises inorganic film layers and an organic film layer stacked;
   the organic film layer is located between any two adjacent inorganic film layers;
   for the inorganic film layer closest to the mirror layer, a thickness of the inorganic film layer at a position of each first opening is less than that of the inorganic film layer at a position of a pattern of the mirror layer.

2. The display panel of claim 1, wherein the transparent filling layer comprises: a first transparent filling layer and a second transparent filling layer, the second transparent filling layer being on a side, away from the base substrate, of the mirror layer;
   the first transparent filling layer comprises a plurality of filling portions separately provided; and
   a part of the filling portions are located in the first openings, and a surface of each filling portion away from the base substrate is substantially flush with a surface of the second transparent filling layer away from the base substrate.

3. The display panel of claim 1, wherein the transparent filling layer comprises a plurality of filling portions separately provided;
   the filling portions are located in the first openings, and a surface of each filling portion away from the base substrate is substantially flush with a surface of the mirror layer away from the base substrate.

4. The display panel of claim 1, wherein a cross-sectional area of each first opening in a direction parallel to the base substrate is gradually increased in a direction from the base substrate to the mirror layer.

5. The display panel of claim 1, further comprising: at least one electrostatic protective portion located on the base substrate and coupled with the mirror layer;
   the electrostatic protective portion is configured to release static electricity in the mirror layer;

the display panel has a display area and a peripheral area, the mirror layer is located in the display area, and the electrostatic protective portion is located in the peripheral area, wherein the electrostatic protective portion comprises a conductive connection portion;

the peripheral area is provided with a constant voltage signal terminal, and the conductive connection portion is coupled with the constant voltage signal terminal.

6. The display panel of claim 5, wherein the mirror layer comprises a metal material, wherein the conductive connection portion and the mirror layer are formed into one piece.

7. The display panel of claim 5, further comprising: a first voltage signal terminal and a second voltage signal terminal;

the electrostatic protective portion comprises a first transistor and a second transistor, wherein a control terminal of the first transistor is coupled to a first terminal of the first transistor, the first terminal of the first transistor is coupled to the first voltage signal terminal, and a second terminal of the first transistor is coupled to a first terminal of the second transistor;

a control terminal of the second transistor is coupled to the first terminal of the second transistor, and a second terminal of the second transistor is coupled to the second voltage signal terminal; and the mirror layer is coupled to the second terminal of the first transistor.

8. The display panel of claim 7, comprising a plurality of the electrostatic protective portions, and the electrostatic protective portions are uniformly distributed around the mirror layer.

9. A display device, comprising: the display panel of claim 1.

10. A display panel, comprising:

a base substrate;

a plurality of light emitting devices on the base substrate;

an encapsulation layer covering the light emitting devices;

a reflective structure layer located on a side of the encapsulation layer away from the base substrate; the reflective structure layer comprises a plurality of first openings; an orthographic projection of each first opening on the base substrate overlaps an orthographic projection of at least one of the light emitting devices on the base substrate;

a transparent filling layer located on a side of the encapsulation layer away from the base substrate, wherein at least part of the transparent filling layer is located in the first openings, wherein the encapsulation layer comprises inorganic film layers and an organic film layer stacked;

the organic film layer is located between any two adjacent inorganic film layers;

for the inorganic film layer closest to the reflective structure layer, a thickness of the inorganic film layer at a position of each first opening is less than that of the inorganic film layer at a position of a pattern of the reflective structure layer.

11. The display panel of claim 10, wherein the transparent filling layer comprises a first transparent filling layer and a second transparent filling layer, the second transparent filling layer being on a side, away from the base substrate, of the reflective structure layer;

the first transparent filling layer comprises a plurality of filling portions separately provided;

a part of the filling portions are located in the first openings, and a surface of each filling portion away from the base substrate is substantially flush with a surface of the second transparent filling layer away from the base substrate.

12. The display panel of claim 10, wherein the transparent filling layer comprises a plurality of filling portions separately provided;

the filling portions are located in the first openings, and a surface of each filling portion away from the base substrate is substantially flush with a surface of the reflective structure layer away from the base substrate.

13. The display panel of claim 10, wherein a cross-sectional area of each first opening in a direction parallel to the base substrate is gradually increased in a direction from the base substrate to the reflective structure layer.

14. The display panel of claim 10, further comprising: at least one electrostatic protective portion located on base substrate and coupled with the reflective structure layer;

the electrostatic protective portion is configured to release static electricity in the reflective structure layer;

the display panel has a display area and a peripheral area, the reflective structure layer is located in the display area, and the electrostatic protective portion is located in the peripheral area, wherein the electrostatic protective portion comprises a conductive connection portion;

the peripheral area is provided with a constant voltage signal terminal, and the conductive connection portion is coupled with the constant voltage signal terminal.

15. The display panel of claim 14, wherein the reflective structure layer comprises a metal material, wherein the conductive connection portion and the reflective structure layer are of an one-piece structure.

16. The display panel of claim 14, further comprising: a first voltage signal terminal and a second voltage signal terminal;

the electrostatic protective portion comprises a first transistor and a second transistor, wherein a control terminal of the first transistor is coupled to a first terminal of the first transistor, the first terminal of the first transistor is coupled to the first voltage signal terminal, and a second terminal of the first transistor is coupled to a first terminal of the second transistor;

a control terminal of the second transistor is coupled to the first terminal of the second transistor, and a second terminal of the second transistor is coupled to the second voltage signal terminal; and the reflective structure layer is coupled to the second terminal of the first transistor.

17. The display panel of claim 16, comprising: a plurality of the electrostatic protective portions, and the electrostatic protective portions are uniformly distributed around the reflective structure layer.

18. A display device, comprising: the display panel of claim 10.

* * * * *